(12) United States Patent
Ahn et al.

(10) Patent No.: US 10,971,516 B2
(45) Date of Patent: Apr. 6, 2021

(54) THREE-DIMENSIONAL SEMICONDUCTOR MEMORY DEVICES AND METHODS OF FABRICATING THE SAME

(71) Applicant: Samsung Electronics Co., Ltd., Suwon-si (KR)

(72) Inventors: Sung-Soo Ahn, Hwaseong-si (KR); Yong-Hoon Son, Yongin-si (KR); Minhyuk Kim, Incheon (KR); Jae Ho Min, Suwon-si (KR); Daehyun Jang, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/294,425

(22) Filed: Mar. 6, 2019

(65) Prior Publication Data
US 2020/0075627 A1 Mar. 5, 2020

(30) Foreign Application Priority Data
Sep. 4, 2018 (KR) ........................ 10-2018-0105507

(51) Int. Cl.
| | | |
|---|---|---|
| *H01L 27/11582* | (2017.01) | |
| *H01L 21/28* | (2006.01) | |
| *H01L 27/11565* | (2017.01) | |
| *H01L 21/311* | (2006.01) | |
| *H01L 27/1157* | (2017.01) | |

(52) U.S. Cl.
CPC .. *H01L 27/11582* (2013.01); *H01L 21/31144* (2013.01); *H01L 27/1157* (2013.01); *H01L 27/11565* (2013.01); *H01L 29/40117* (2019.08)

(58) Field of Classification Search
CPC ......... H01L 27/11582; H01L 29/40117; H01L 27/1157; H01L 27/11556; H01L 27/11575
See application file for complete search history.

(56) References Cited

U.S. PATENT DOCUMENTS

| | | | |
|---|---|---|---|
| 8,278,699 B2* | 10/2012 | Tanaka ................ | H01L 29/7889 257/324 |
| 8,405,141 B2* | 3/2013 | Matsuda ........... | H01L 27/11573 257/324 |
| 8,809,938 B2 | 8/2014 | Hwang et al. | |

(Continued)

FOREIGN PATENT DOCUMENTS

KR 101487746 2/2015

*Primary Examiner* — Laura M Menz
*Assistant Examiner* — Khatib A Rahman
(74) *Attorney, Agent, or Firm* — Myers Bigel, P.A.

(57) ABSTRACT

Integrated circuit devices and methods of forming the same are provided. The devices may include a substrate including a cell region and an extension region and conductive layers stacked on the cell region in a vertical direction. The conductive layers may extend onto the extension region and may have a stair-step structure on the extension region. The devices may also include vertical structures on the substrate. Each of the vertical structures may extend in the vertical direction, and the vertical structures may include a first vertical structure on the cell region and a second vertical structure on the extension region. The first vertical structure may extend through the conductive layers and may include a first channel layer, the second vertical structure may be in the stair-step structure and may include a second channel layer, and the second channel layer may be spaced apart from the substrate in the vertical direction.

20 Claims, 35 Drawing Sheets

(56) References Cited

U.S. PATENT DOCUMENTS

| | | | |
|---|---|---|---|
| 9,735,170 B2 | 8/2017 | Chae et al. | |
| 9,786,681 B1* | 10/2017 | Ariyoshi | H01L 29/6656 |
| 10,269,820 B1* | 4/2019 | Kaminaga | H01L 27/11565 |
| 10,304,852 B1* | 5/2019 | Cui | H01L 21/76229 |
| 10,355,009 B1* | 7/2019 | Kai | H01L 27/11526 |
| 10,622,369 B2* | 4/2020 | Zhou | H01L 27/11548 |
| 10,818,687 B2* | 10/2020 | Kim | H01L 27/11556 |
| 10,861,863 B2* | 12/2020 | Kim | H01L 27/11582 |
| 2009/0230449 A1* | 9/2009 | Sakaguchi | H01L 27/11575 |
| | | | 257/298 |
| 2010/0133598 A1* | 6/2010 | Chae | H01L 27/11578 |
| | | | 257/314 |
| 2010/0133599 A1* | 6/2010 | Chae | H01L 27/11565 |
| | | | 257/315 |
| 2015/0236038 A1* | 8/2015 | Pachamuthu | H01L 27/11524 |
| | | | 257/326 |
| 2016/0322381 A1* | 11/2016 | Liu | H01L 29/40114 |
| 2017/0077108 A1 | 3/2017 | Kawaguchi et al. | |
| 2017/0162595 A1 | 6/2017 | Kitahara | |
| 2017/0179153 A1* | 6/2017 | Ogawa | H01L 23/5226 |
| 2017/0243879 A1* | 8/2017 | Yu | H01L 27/1157 |
| 2017/0373087 A1* | 12/2017 | Ito | H01L 27/11573 |
| 2018/0053768 A1* | 2/2018 | Kim | H01L 27/11575 |
| 2018/0108671 A1* | 4/2018 | Yu | H01L 27/11565 |
| 2018/0122907 A1 | 5/2018 | Choi et al. | |
| 2018/0151672 A1* | 5/2018 | Choi | H01L 27/1157 |
| 2019/0296034 A1* | 9/2019 | Nagashima | H01L 21/76224 |
| 2019/0386108 A1* | 12/2019 | Nishikawa | H01L 27/11556 |
| 2020/0006358 A1* | 1/2020 | Nishikawa | H01L 21/76897 |
| 2020/0051995 A1* | 2/2020 | Tanaka | H01L 27/11565 |

* cited by examiner

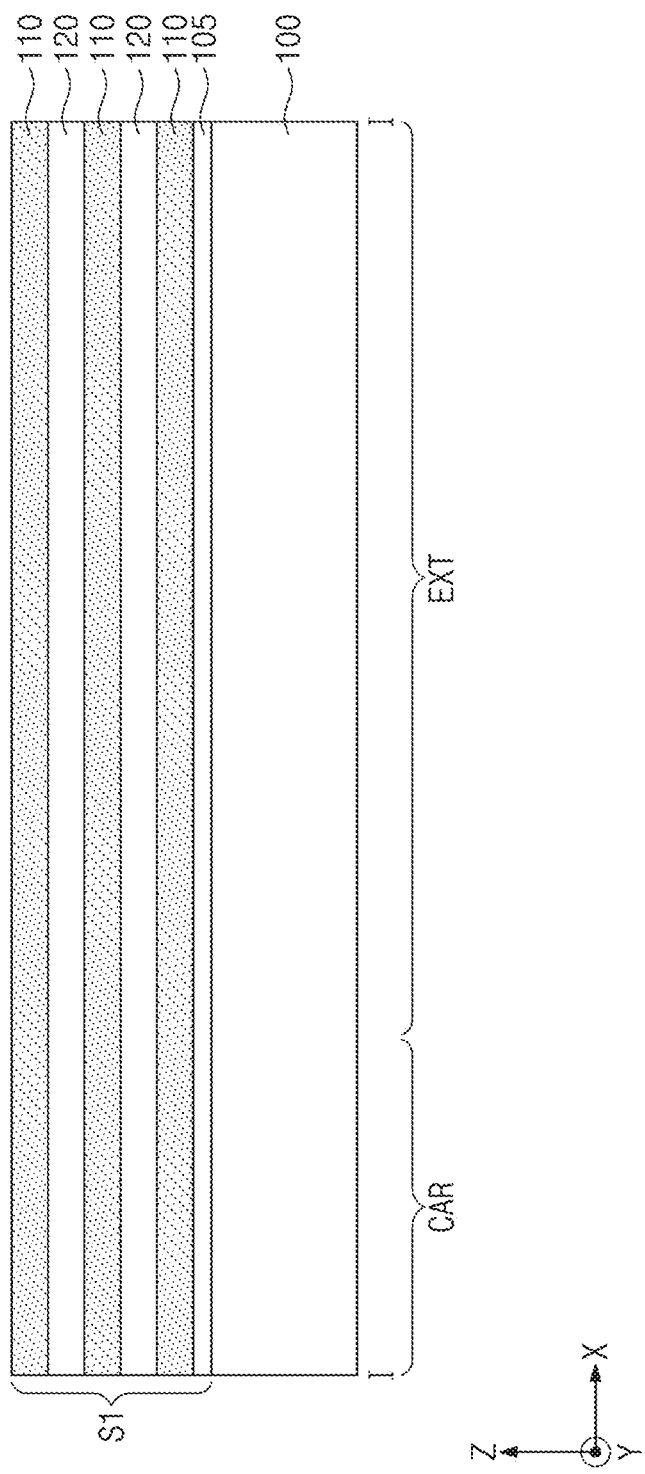

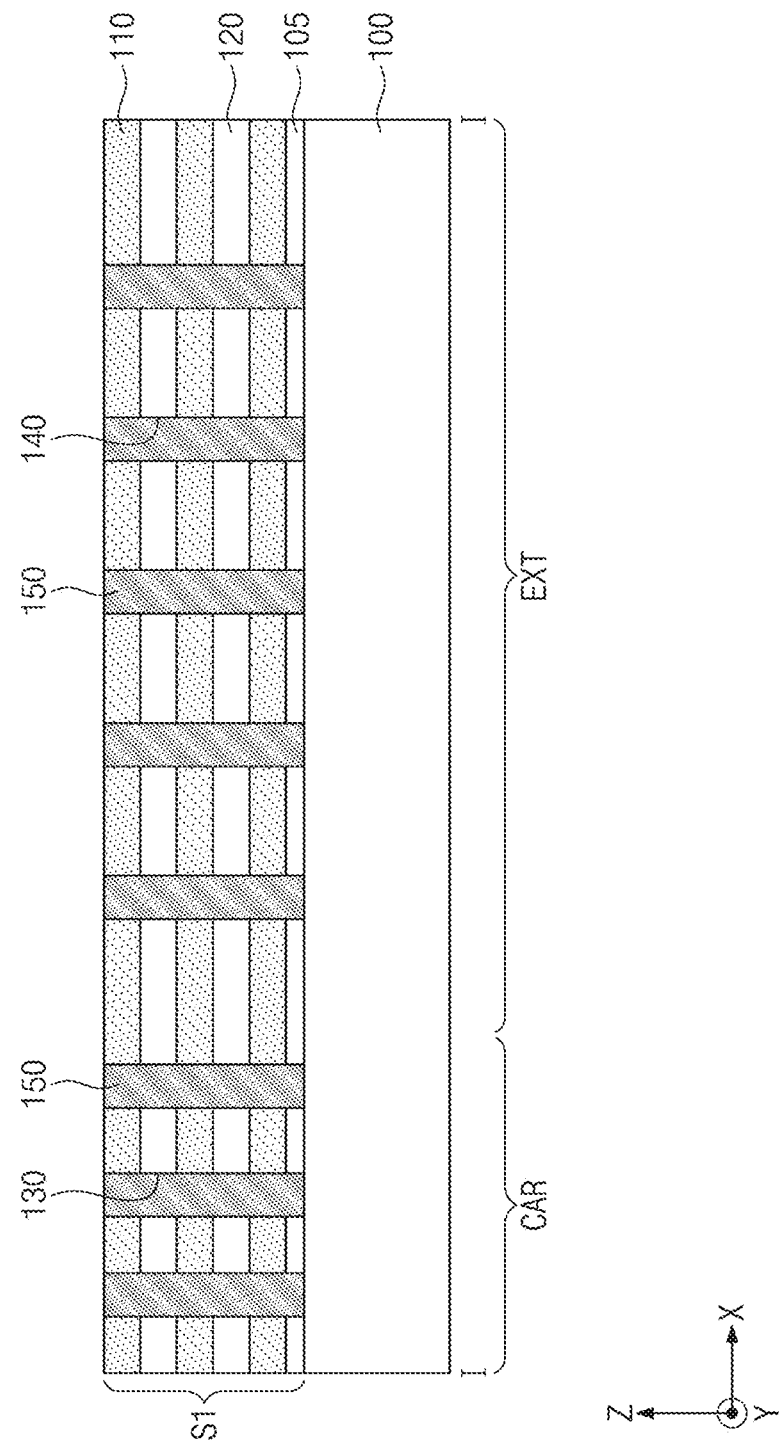
FIG. 2B_1

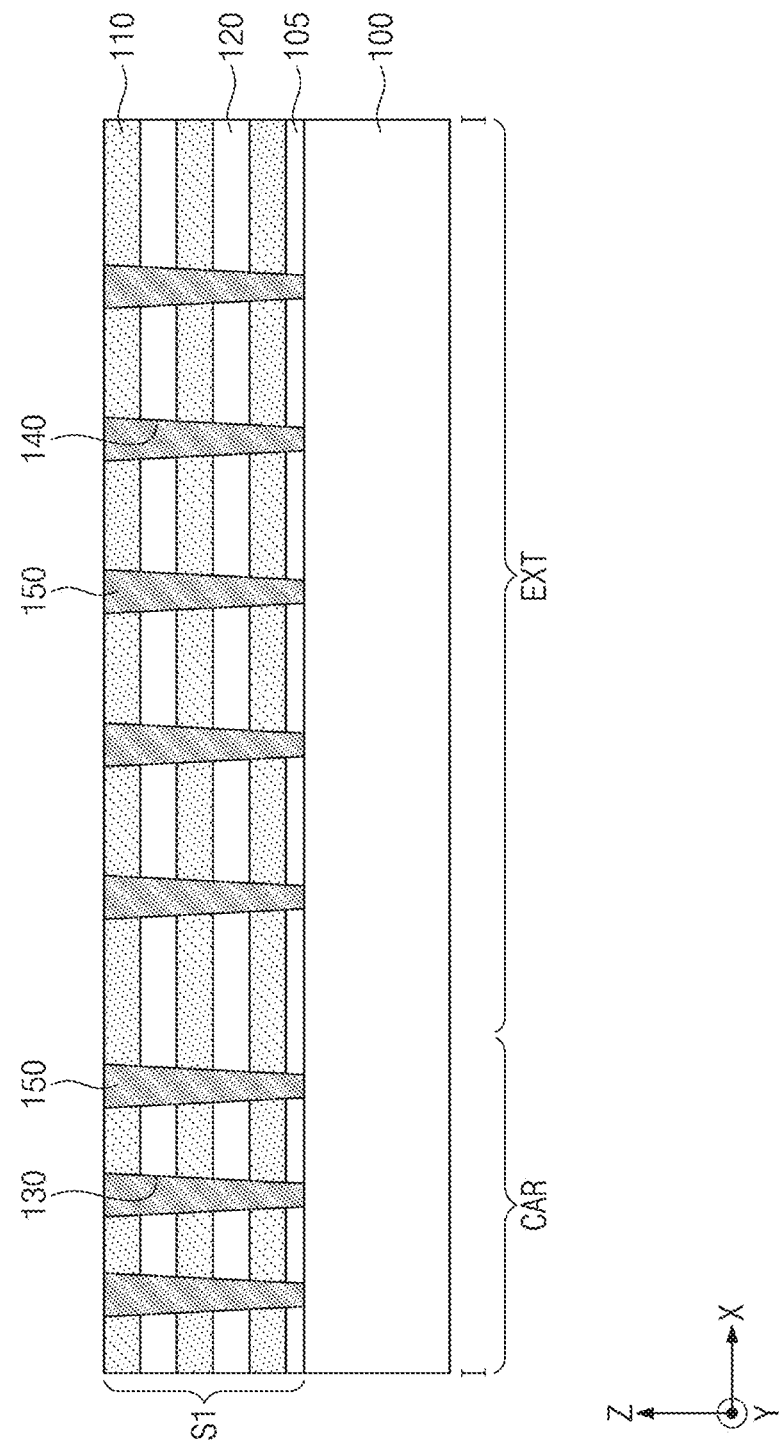

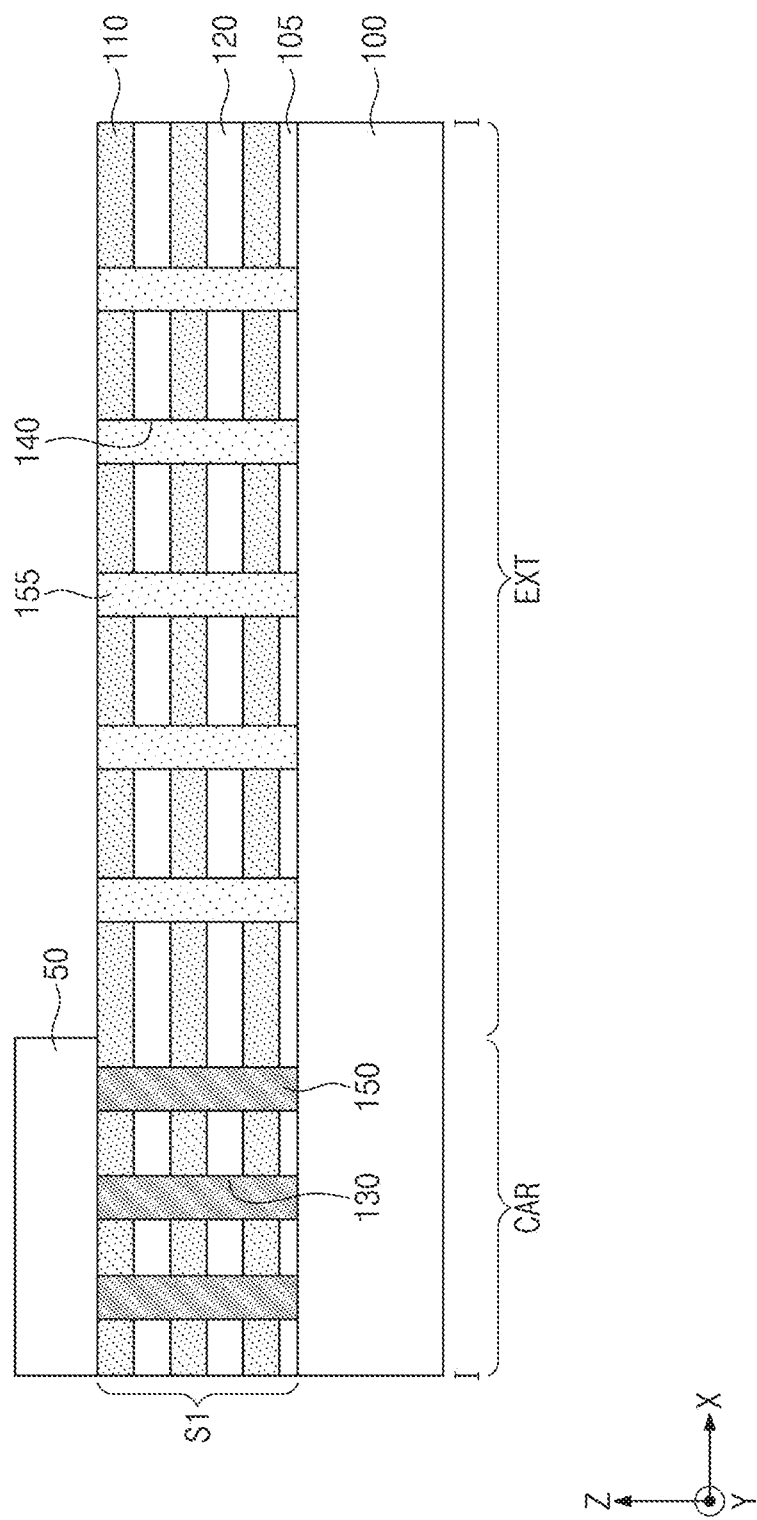

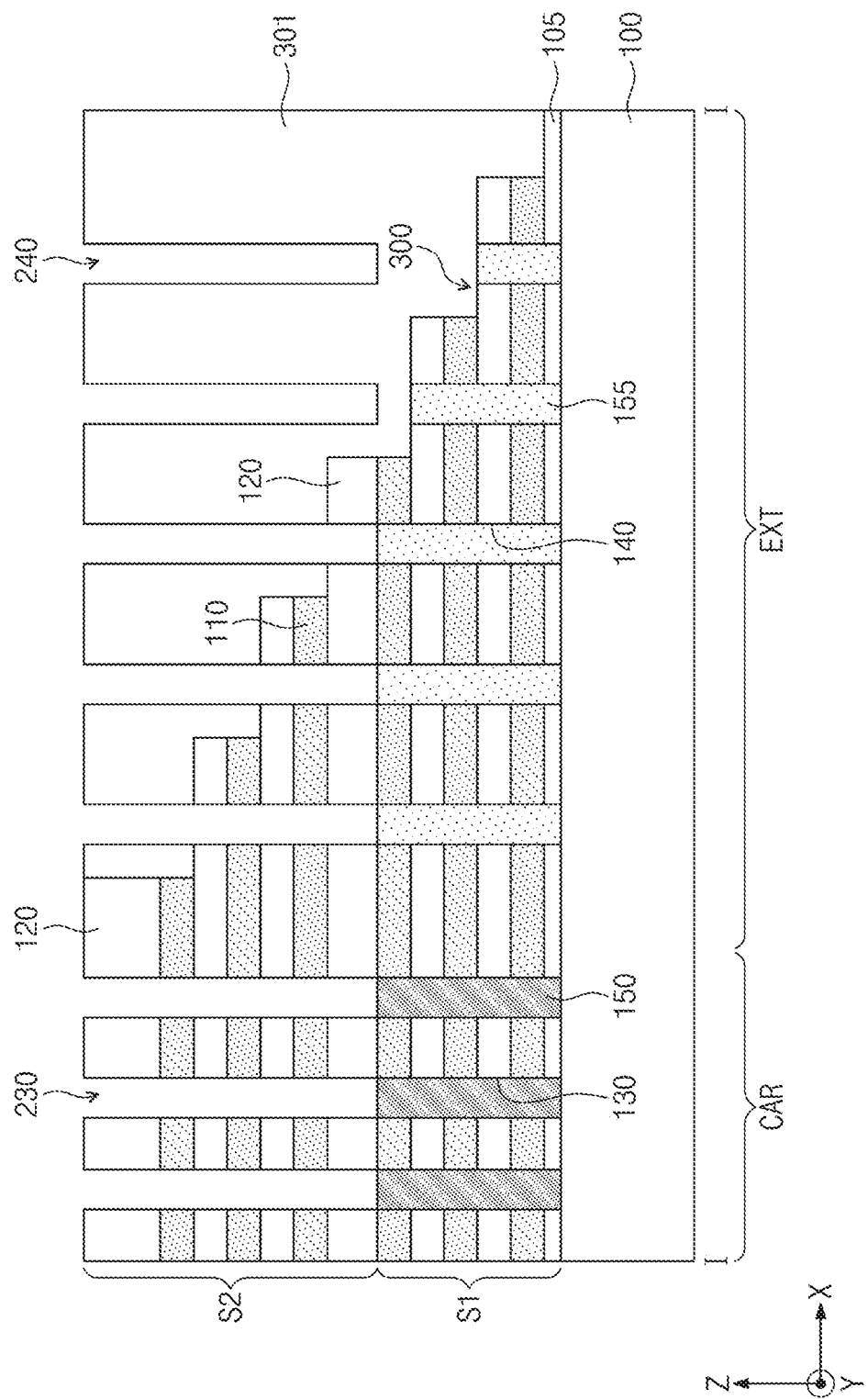
FIG. 2G_1

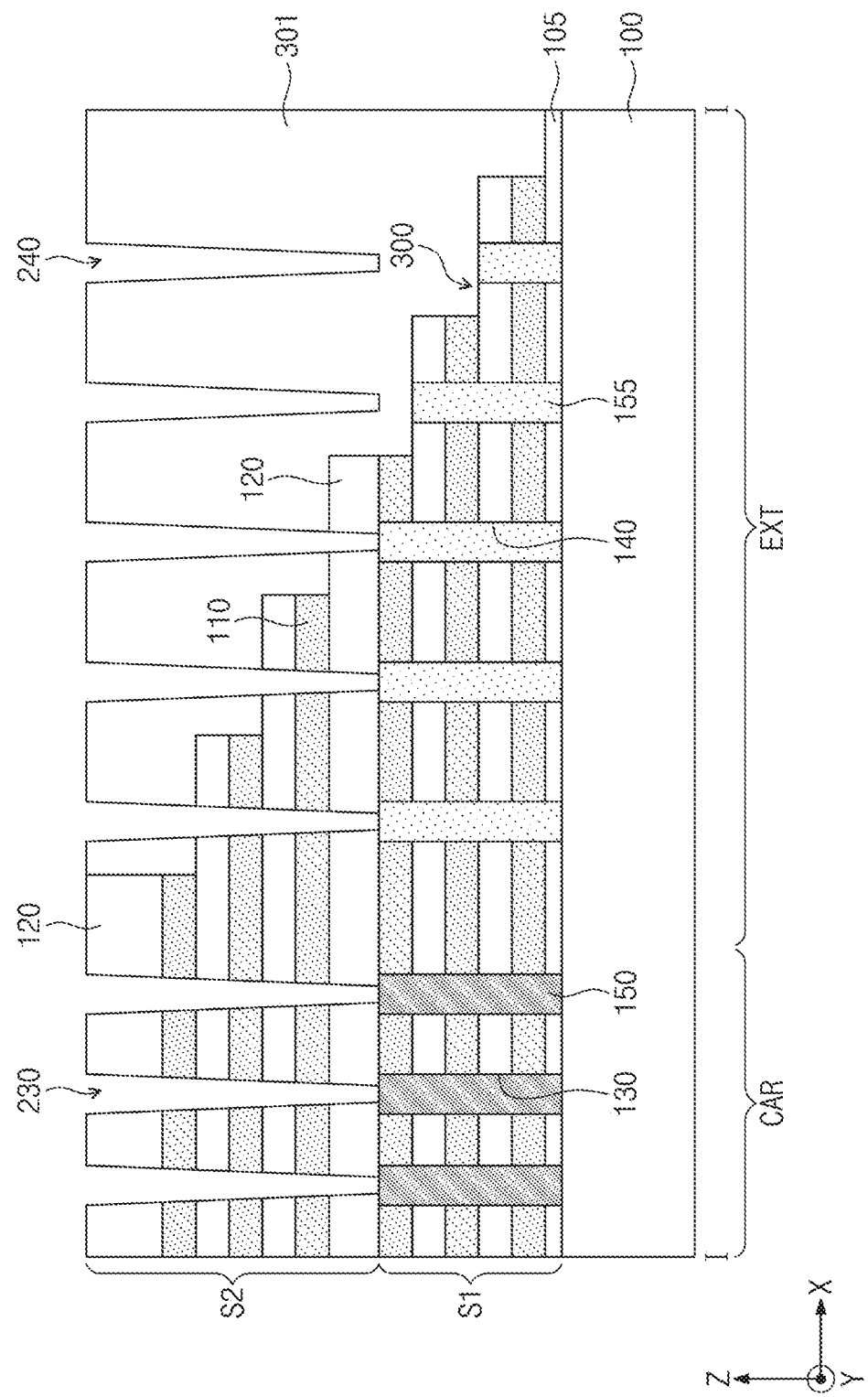
FIG. 2G_2

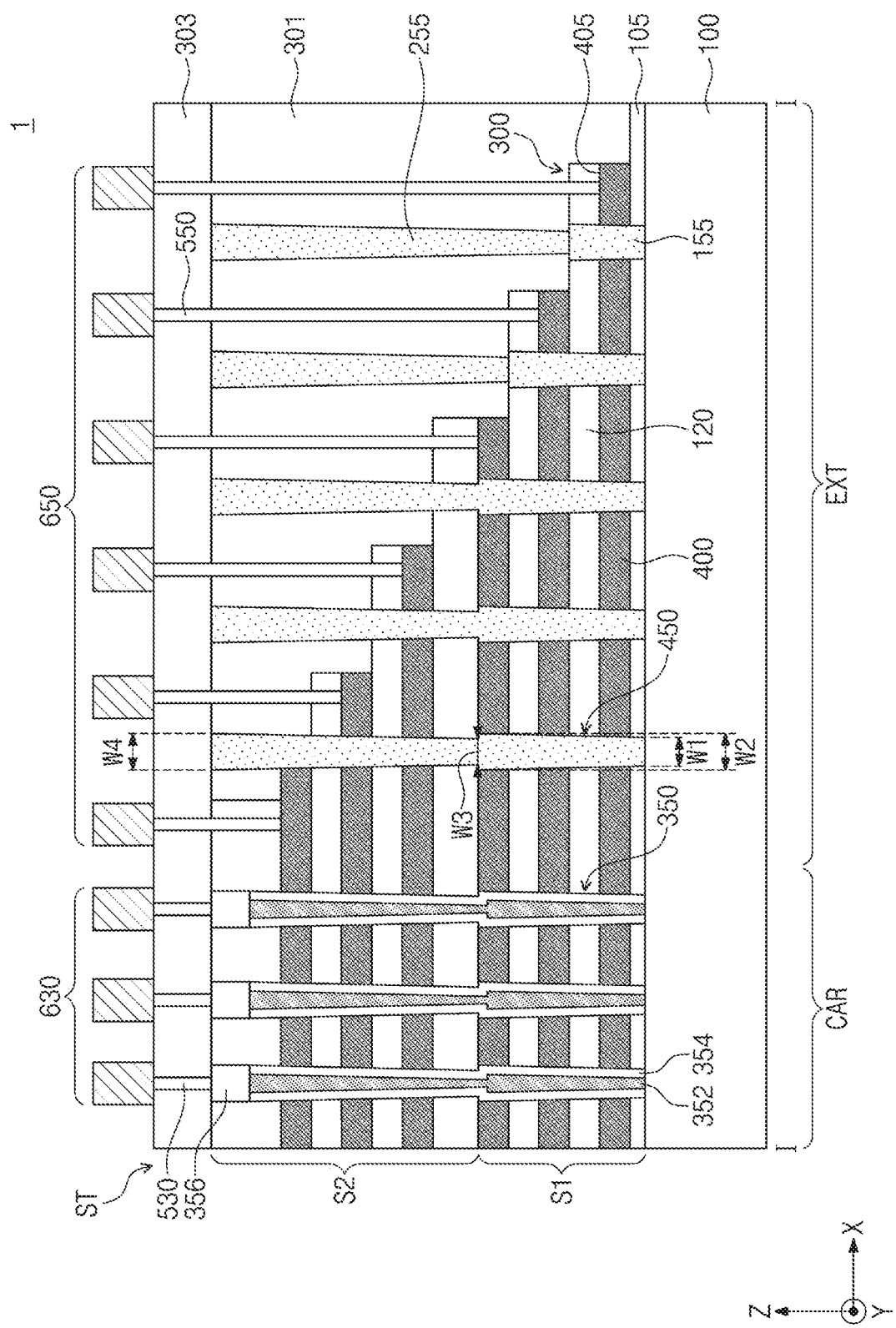

THREE-DIMENSIONAL SEMICONDUCTOR MEMORY DEVICES AND METHODS OF FABRICATING THE SAME

CROSS-REFERENCE TO RELATED APPLICATION

This U.S. non-provisional application claims priority under 35 U.S.C § 119 to Korean Patent Application No. 10-2018-0105507, filed on Sep. 4, 2018, in the Korean Intellectual Property Office, the entire disclosure of which is hereby incorporated by reference herein.

BACKGROUND

The present disclosure relates to the field of electronics and, more particularly, to a semiconductor device.

Integration density of semiconductor devices has increased for high performance and low manufacturing cost of semiconductor devices. Since integration density of the semiconductor devices may be one of the major factors in determining price, increasing integration density may be beneficial. Integration density of two-dimensional or planar semiconductor memory devices may heavily depend on the area occupied by a unit memory cell, such that integration density may be influenced by the level of technology for forming fine patterns.

Expensive equipment may be used to form fine patterns, and thus three-dimensional semiconductor memory devices have been developed to overcome limitations of two-dimensional semiconductor memory devices.

SUMMARY

Some example embodiments of the present inventive concepts provide three-dimensional semiconductor memory devices fabricated using a simplified fabrication process.

Some example embodiments of the present inventive concepts provide methods of fabricating a three-dimensional semiconductor memory device, which methods can be performed by a simplified fabrication process.

According to some embodiments of the present inventive concepts, integrated circuit devices may include a substrate including a cell region and an extension region arranged along a horizontal direction and a plurality of conductive layers stacked on the cell region in a vertical direction that is perpendicular to the horizontal direction. The plurality of conductive layers may extend onto the extension region and may have a stair-step structure on the extension region. The integrated circuit devices may also include a plurality of vertical structures on the substrate. Each of the plurality of vertical structures may extend in the vertical direction, and the plurality of vertical structures may include a first vertical structure on the cell region and a second vertical structure on the extension region. The first vertical structure may extend through the plurality of conductive layers and may include a first channel layer, the second vertical structure may be in the stair-step structure of the plurality of conductive layers and may include a second channel layer, and the second channel layer may be spaced apart from the substrate in the vertical direction.

According to some embodiments of the present inventive concepts, integrated circuit devices may include a substrate including a first region and a second region arranged along a horizontal direction and a stack structure on the substrate. The stack structure may include a plurality of conductive layers stacked on the first region of the substrate in a vertical direction that is perpendicular to the horizontal direction, and the plurality of conductive layers may extend onto the second region of the substrate and may have a stair-step structure on the second region of the substrate. The integrated circuit devices may also include a plurality of vertical structures on the substrate. Each the plurality of vertical structures may extend in the vertical direction. The plurality of vertical structures may include a first vertical structure that is on the first region of the substrate and extends through the plurality of conductive layers, a second vertical structure that is on the second region of the substrate and extends through the stair-step structure of the plurality of conductive layers, and a third vertical structure overlaps and is spaced apart from the second vertical structure in the vertical direction.

According to some embodiments of the present inventive concepts, integrated circuit devices may include a substrate including a cell region and an extension region arranged along a horizontal direction and a stack structure on the substrate. The stack structure may include a plurality of conductive layers stacked on the cell region in a vertical direction that is perpendicular to the horizontal direction, and the plurality of conductive layers may extend onto the extension region and may have a stair-step structure on the extension region. The integrated circuit devices may also include a plurality of vertical structures on the substrate. The plurality of vertical structures may include a first vertical structure extending through the plurality of conductive layers on the cell region and a second vertical structure extending through the stair-step structure of the plurality of conductive layers, the second vertical structure may include a lower portion and an upper portion sequentially stacked on the substrate, and the upper portion of the second vertical structure may include a material different from the lower portion of the second vertical structure.

According to some embodiments of the present inventive concepts, methods of forming an integrated circuit device may include forming a lower stack structure on a substrate that includes a first region and a second region. The lower stack structure may include a plurality of lower sacrificial layers alternating with a plurality of lower insulating layers. The methods may also include forming a plurality of lower sacrificial vertical structures extending through the lower stack structure on the first region and a plurality of lower dummy vertical structures extending through the lower stack structure on the second region and forming an upper stack structure on the plurality of lower sacrificial vertical structures and the plurality of lower dummy vertical structures. The upper stack structure may include a plurality of upper sacrificial layers alternating with a plurality of upper insulating layers. The methods may further include forming a stair-step structure on the second region by etching portions of the upper stack structure and the lower stack structure on the second region and forming a plurality of upper sacrificial vertical structures extending through the upper stack structure on the first region and a plurality of upper dummy vertical structures on the second region. The plurality of upper sacrificial vertical structures may directly contact the plurality of lower sacrificial vertical structures, respectively, and the plurality of upper dummy vertical structures may overlap the plurality of lower dummy vertical structures, respectively. Additionally, the method may include removing the plurality of lower sacrificial vertical structures and the plurality of upper sacrificial vertical structures to form a plurality of channel holes extending through the upper stack structure and the lower stack structure and forming a plurality of channel structures in the plurality of channel holes, respectively.

BRIEF DESCRIPTION OF THE DRAWINGS

FIGS. 2A to 2L illustrate cross-sectional views taken along the line I-I of FIG. 1B showing a method of fabricating a three-dimensional semiconductor memory device according to some example embodiments of the present inventive concepts.

FIGS. 2M to 2Q illustrate cross-sectional views taken along the line I-I of FIG. 1B, and each of FIGS. 2M to 2Q shows a three-dimensional semiconductor memory device according to some example embodiments of the present inventive concepts.

DETAILED DESCRIPTION

Three-dimensional semiconductor memory devices and methods of fabricating the same according to some example embodiments of the present inventive concepts will be described.

As used herein the term "and/or" includes any and all combinations of one or more of the associated listed items.

It will be understood that "an element A covers an element B" (or similar language) means that the element A is on the element B but does not necessarily mean that the element A covers the element B entirely. It will be also understood that "formed concurrently" refers to being formed in a same fabrication step, at approximately (but not necessarily exactly) the same time.

Figure 1A:
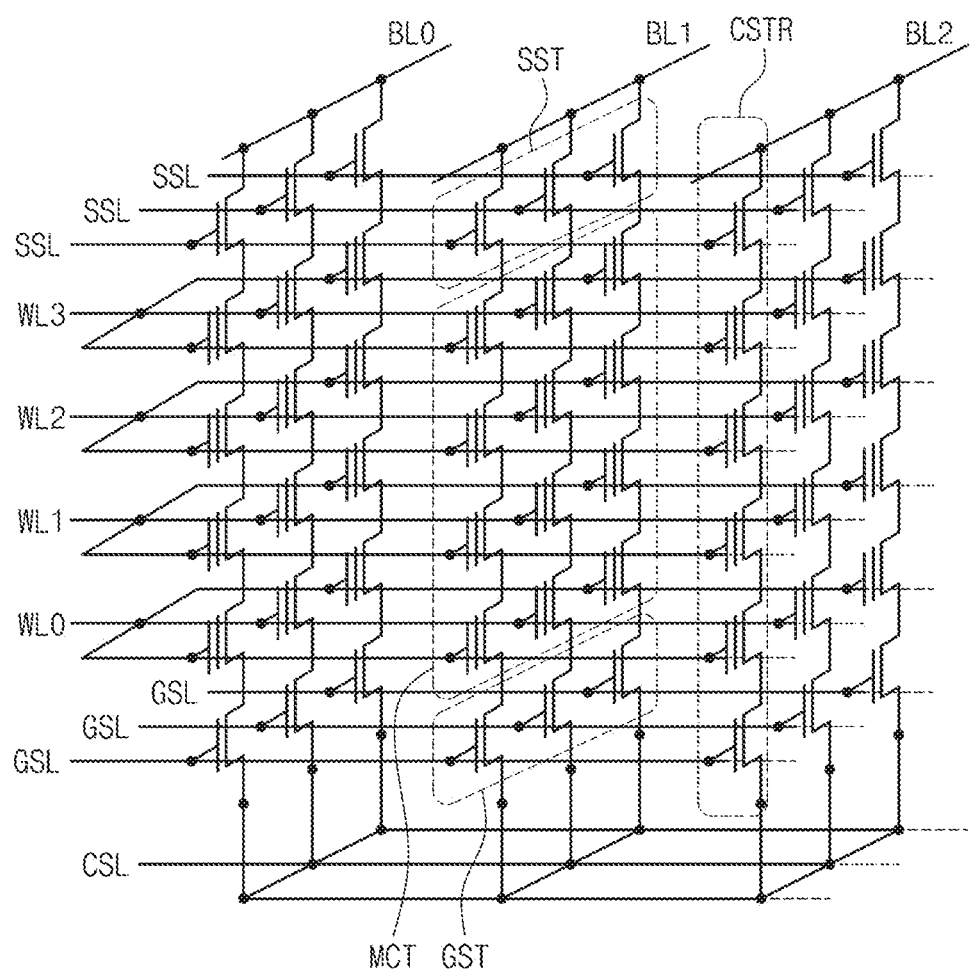
FIG. 1A illustrates an equivalent circuit diagram of a three-dimensional semiconductor memory device according to some example embodiments of the present inventive concepts.

FIG. 1A illustrates an equivalent circuit diagram of a three-dimensional semiconductor memory device according to some example embodiments of the present inventive concepts.

Referring to FIG. 1A, a three-dimensional semiconductor memory device 1 may include a common source line CSL, a plurality of bit lines BL0 to BL2, and a plurality of cell strings CSTR between the common source line CSL and the bit lines BL0 to BL2. The three-dimensional semiconductor memory device 1 may be, for example, a vertical NAND Flash memory device.

The bit lines BL0 to BL2 may be arranged two-dimensionally, and a plurality of cell strings CSTR may be connected in parallel to one of the bit lines BL0 to BL2. The cell strings CSTR may be connected in common to the common source line CSL. A plurality of cell strings CSTR may be disposed between the common source line CSL and each of the bit lines BL0 to BL2. The common source line CSL may be provided in plural, and the plurality of common source lines CSL may be arranged two-dimensionally. The common source lines CSL may be supplied with the same voltage or electrically controlled independently of each other.

Each of the cell strings CSTR may include a ground select transistor GST connected to the common source line CSL, a string select transistor SST connected to one of the bit lines BL0 to BL2, and a plurality of memory cell transistors MCT disposed between the ground and string select transistors GST and SST. The ground select transistor GST, the string select transistor SST, and the memory cell transistors MCT may be connected in series.

The common source line CSL may be connected in common to the ground select transistors GST. A plurality of ground select lines GSL, a plurality of word lines WL0 to WL3, and a plurality of string select lines SSL between the common source line CSL and the bit lines BL0 to BL2 may be used as gate electrodes of the ground select transistor GST, the memory cell transistors MCT, and the string select transistor SST, respectively. Each of the memory cell transistors MCT may include a data storage element, for example, an insulator that can trap charge carriers (e.g., electrons). Although, FIG. 1A illustrates that four word lines WL0 to WL3 are between the ground select line GSL and the string select line SSL, it will be understood that more than four word lines can be provided between the ground select line GSL and the string select line SSL.

Figure 1B:
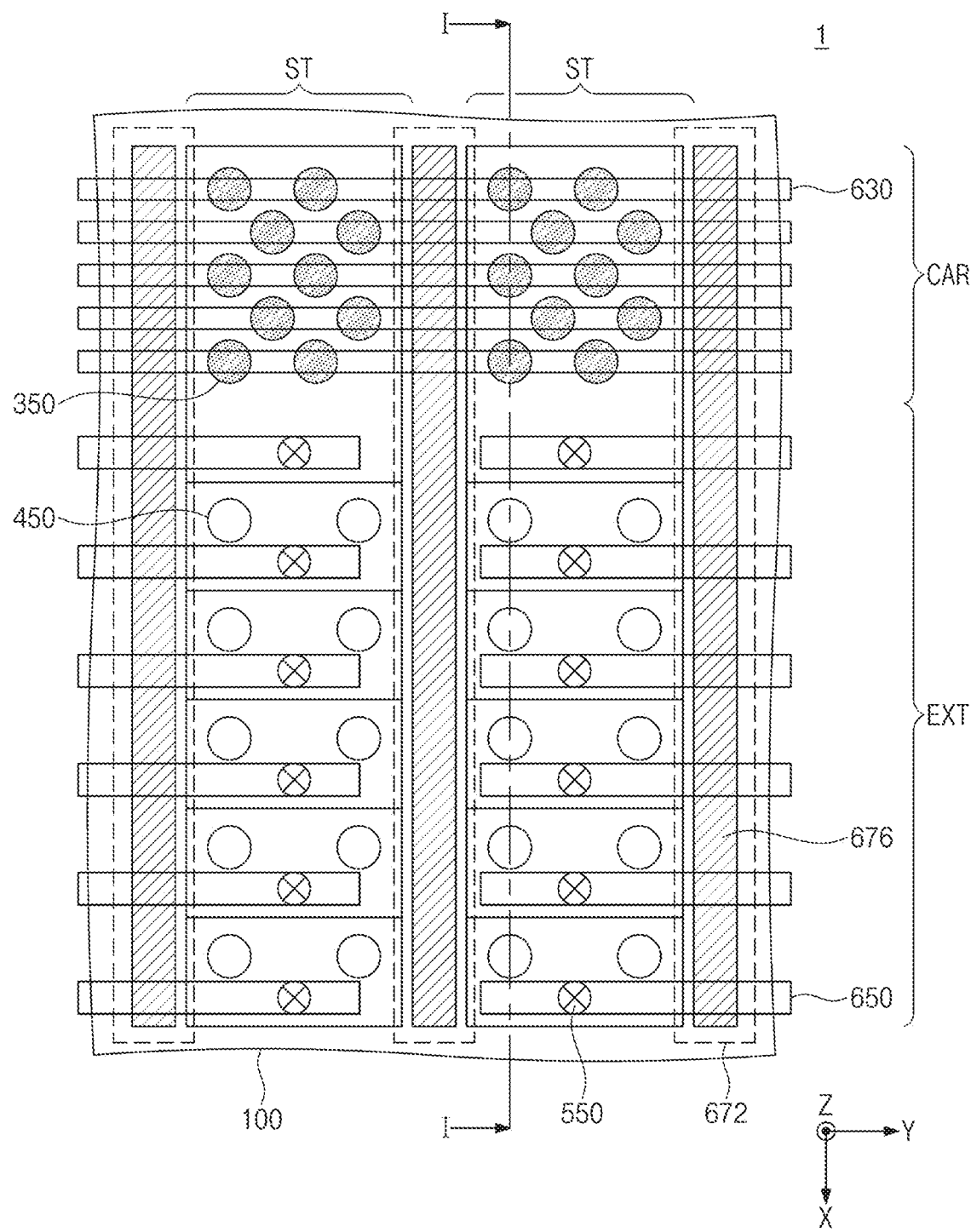
FIG. 1B illustrates a plan view showing a three-dimensional semiconductor memory device according to some example embodiments of the present inventive concepts.

FIG. 1B illustrates a plan view showing a three-dimensional semiconductor memory device according to some example embodiments of the present inventive concepts.

Referring to FIG. 1B, a three-dimensional semiconductor memory device 1 may include a plurality of stack structures ST that extend in a first direction X on a semiconductor substrate 100, a plurality of vertical channels 350 and dummy vertical channels 450 that penetrate each of the stack structures ST in a third direction Z, a plurality of bit lines 630 that are electrically connected to the vertical channels 350 and extend in a second direction Y, a plurality of metal lines 650 that are electrically connected through metal contacts 550 to the stack structures ST and extend in the second direction Y, and a plurality of common source plugs 676 that extend in the first direction X between the stack structures ST and are electrically insulated from the stack structures ST.

The first and second directions X and Y may be horizontal directions that are substantially perpendicular to each other and extend along the semiconductor substrate 100. The first and second directions X and Y may be parallel to an upper surface of the semiconductor substrate 100. The third direction Z may be a vertical direction that is substantially perpendicular to both the first and second directions X and Y and vertically extends from the semiconductor substrate 100.

The three-dimensional semiconductor memory device 1 may be divided into a cell array region CAR and an extension region EXT. The vertical channels 350 may be provided on the cell array region CAR, and the dummy vertical channels 450 may be provided on the extension region EXT. The bit lines 630 may run along the second direction Y across the cell array region CAR, and the metal lines 650 may run along the second direction Y across the extension region EXT. In some embodiments, each of the bit lines 630 and each of the metal lines 650 may extend longitudinally in the second direction Y, as illustrated in FIG. 1B. The stack structures ST and the common source plugs 676 may extend in the first direction X along a common source 672 provided in the semiconductor substrate 100. In some embodiments, each of the stack structures ST and the common source plugs 676 may extend longitudinally in the first direction X, as illustrated in FIG. 1B.

The vertical channels 350 may have a vertical pillar shape that is continuous along the third direction Z. The dummy vertical channels 450 may have a vertical pillar shape that is continuous or discontinuous along the third direction Z. In some embodiments, the vertical channels 350 may have a U shape or a bent pipe shape when viewed in cross section. Although FIG. 1B shows that the vertical channels 350 and the dummy vertical channels 450 have the same shape and size in a plan view, the present inventive concepts are not limited thereto. In some embodiments, the vertical channels 350 and the dummy vertical channels 450 may have different shapes and sizes.

FIGS. 2A to 2L illustrate cross-sectional views taken along the line I-I of FIG. 1B showing a method of fabricating a three-dimensional semiconductor memory device according to some example embodiments of the present inventive concepts.

Referring to FIG. 2A, a semiconductor substrate 100 may include a cell array region CAR and an extension region EXT. The semiconductor substrate 100 may be a silicon wafer having a first conductivity type (e.g., P-type). A plurality of mold sacrificial layers 110 and a plurality of mold dielectric layers 120 may be alternately and repeatedly stacked on the semiconductor substrate 100 and may form a first stack S1. A dielectric buffer layer 105 may further be formed between the semiconductor substrate 100 and a lowermost mold sacrificial layer 110. The mold sacrificial layers 110 and the mold dielectric layers 120 may be formed of dielectric materials having an etch selectivity with respect to each other. The dielectric buffer layer 105 may be formed of a dielectric material that is the same as or similar to that of the mold dielectric layers 120. For example, the mold sacrificial layers 110 may include silicon nitride, and the mold dielectric layers 120 and the dielectric buffer layer 105 may include silicon oxide.

Referring to FIGS. 2B_1 and 2B_2, a plurality of first sacrificial pillars 150 may be formed to penetrate (e.g., extend through) the first stack S1. For example, an etching process may be performed on the first stack S1 to form one or more first vertical holes 130 that vertically penetrate the first stack S1 and also to form one or more first dummy vertical holes 140 that vertically penetrate the first stack S1, and then the first sacrificial pillars 150 may be formed to fill the first vertical holes 130 and the first dummy vertical holes 140. The first vertical holes 130 may be provided on the cell array region CAR, and the first dummy vertical holes 140 may be provided on the extension region EXT. The first vertical holes 130 and the first dummy vertical holes 140 may have a hollow pillar shape, such as a hollow circular pillar shape, a hollow oval pillar shape, or a hollow polygonal pillar shape and may expose the semiconductor substrate 100. The first sacrificial pillars 150 may be formed by depositing, in the first vertical holes 130 and the first dummy vertical holes 140, a material having an etch selectivity with respect to the mold sacrificial layers 110 and the mold dielectric layers 120. For example, the first sacrificial pillars 150 may include a semiconductor material such as polysilicon or a metallic material such as tungsten. It will be understood that the term "pillar" used herein refers to a vertical structure having various shapes.

In some embodiments, each of the first vertical holes 130 and the first dummy vertical holes 140 may have a side perpendicular to an upper surface of the semiconductor substrate 100 and may have a uniform width in the first direction X along the third direction Z, as illustrated in FIG. 2B_1. In some embodiments, each of the first vertical holes 130 and the first dummy vertical holes 140 may have a side slanted with respect to the upper surface of the semiconductor substrate 100 and may have a non-uniform width in the first direction X, which increases along the third direction Z, as illustrated in FIG. 2B_2.

Referring to FIG. 2C, the first sacrificial pillars 150 on the extension region EXT may be replaced with first inactive pillars 155. For example, a mask pattern 50 may be formed on the first stack S1 on the cell array region CAR, and an etching process may be performed in which the mask pattern 50 is used as an etching mask to remove the first sacrificial pillars 150 from the first dummy vertical holes 140. A dielectric material may be deposited in empty first dummy vertical holes 140 from which the first sacrificial pillars 150 are removed, which deposition may form the first inactive pillars 155 on the extension region EXT. The mask pattern 50 may include, for example, photoresist or other material having an etch selectivity with respect to the mold sacrificial layers 110 and the mold dielectric layers 120. The first inactive pillars 155 may include a dielectric material having no or low etch selectivity with respect to the mold sacrificial layers 110 and the mold dielectric layers 120. In some embodiments, the mold sacrificial layers 110 may include silicon nitride, the mold dielectric layers 120 may include silicon oxide, and the first inactive pillars 155 may include silicon oxide, silicon nitride, or a combination thereof. The mask pattern 50 may be removed by, for example, an ashing process or a strip process after the first inactive pillars 155 are formed.

It will be understood that if two materials have no etch selectivity or a low etch selectivity to each other, those two materials can be etched at the same etch rate or a similar etch rate by an etch process.

Figure 2D:
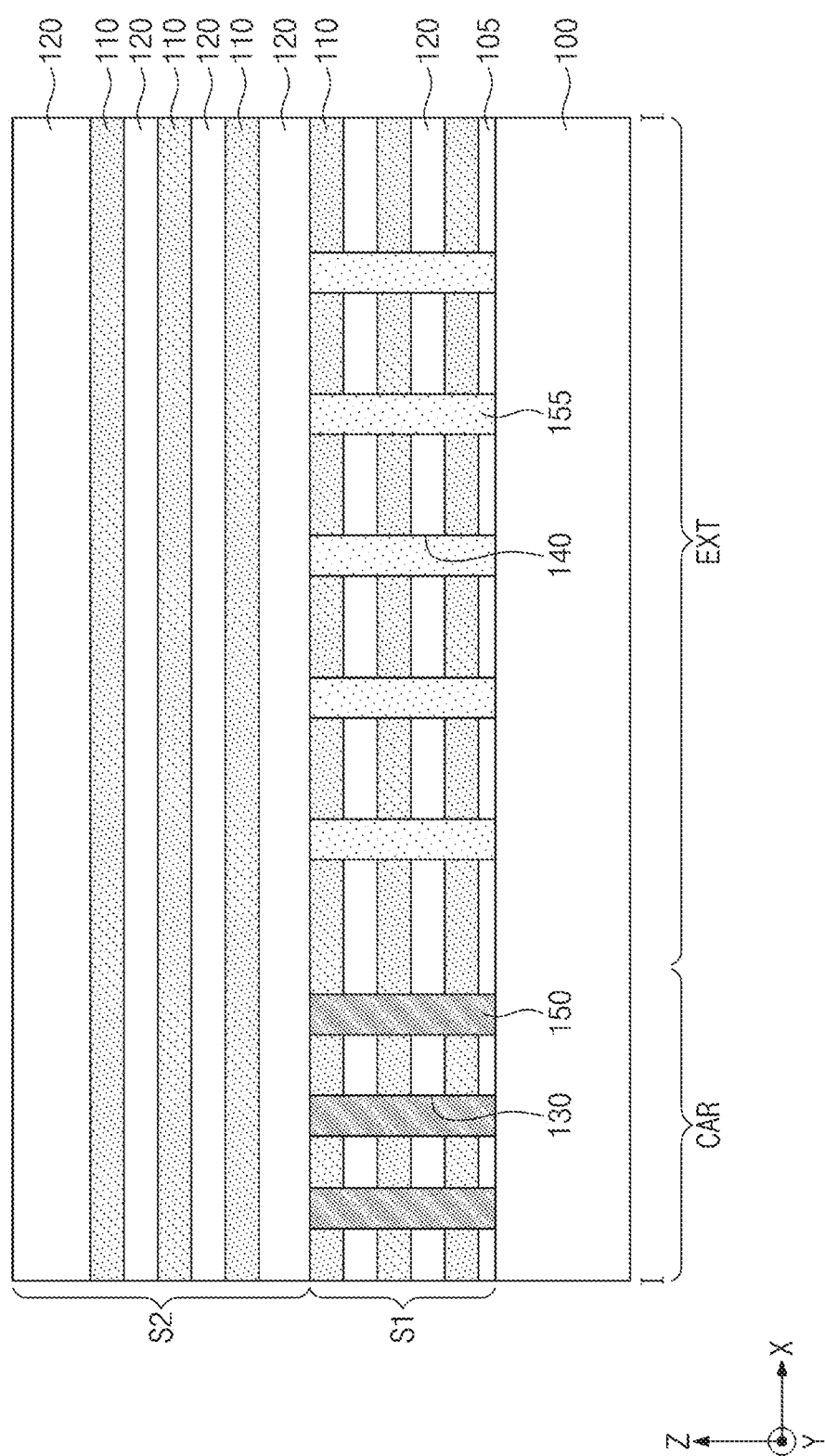

Referring to FIG. 2D, a second stack S2 may be formed on the semiconductor substrate 100. The second stack S2 may be stacked on the first stack S1. The second stack S2 may be the same as or similar to the first stack S1. For example, a plurality of mold sacrificial layers 110 and a plurality of mold dielectric layers 120 may be alternately and repeatedly stacked on the first stack S1 and may form the second stack S2. The mold sacrificial layers 110 and the mold dielectric layers 120 of the second stack S2 may include materials the same as or similar to those of the mold sacrificial layers 110 and the mold dielectric layers 120 of the first stack S1. For example, the mold sacrificial layers 110 of the second stack S2 may include silicon nitride, and the mold dielectric layers 120 of the second stack S2 may include silicon oxide. A lowermost mold dielectric layer 120 of the second stack S2 may serve as a buffer layer. In some embodiments, the lowermost mold dielectric layer 120 of the second stack S2 may be formed thicker than adjacent other mold dielectric layers 120, as illustrated in FIG. 2D.

Figure 2E:
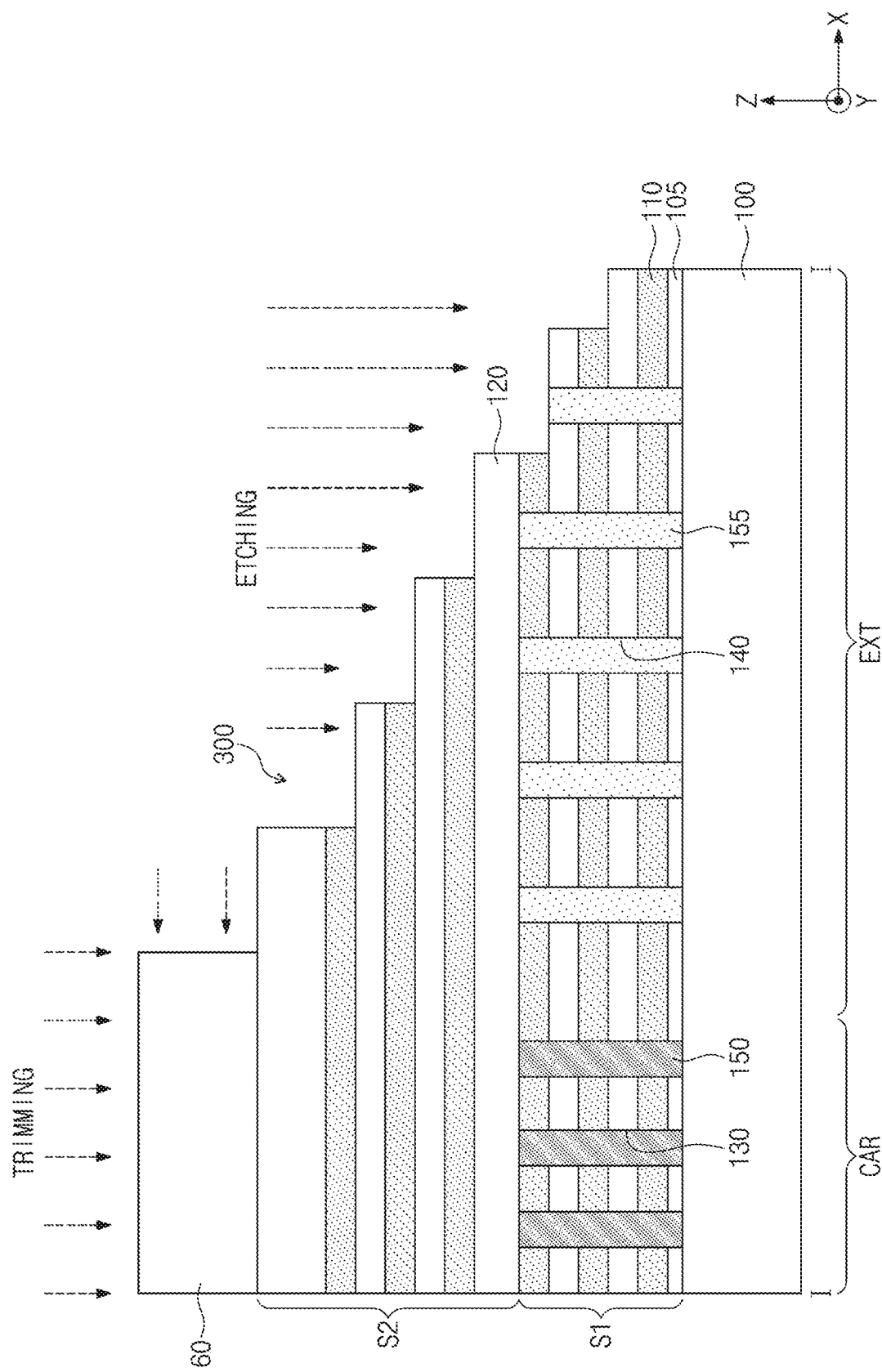

Referring to FIG. 2E, a stair-step structure 300 may be formed on the semiconductor substrate 100. The stair-step structure 300 may be formed by performing multiple etching processes on the first and second stacks S1 and S2 and multiple trimming processes on an etching mask (e.g., a mask pattern 60 in FIG. 2E). For example, a photoresist layer may be coated on the second stack S2 and then patterned to form a mask pattern 60. An etching process may be performed in which the mask pattern 60 is used as an etching mask to first etch an uppermost mold dielectric layer 120 and an uppermost mold sacrificial layer 110. The mask pattern 60 may undergo a trimming process to reduce a size of the mask pattern 60, and the reduced mask pattern 60 may be used as an etching mask to second etch the uppermost mold dielectric layer 120 and the uppermost mold sacrificial layer 110 that had been etched. In such cases, the uppermost mold dielectric layer 120 and the uppermost sacrificial layer 110 may serve as an etching mask to etch a second-uppermost mold dielectric layer 120 and a second-uppermost sacrificial layer 110.

The trimming processes and the etching processes may be performed multiple times to reduce (e.g., gradually reduce) the size of the mask pattern 60 and to repeatedly etch the mold dielectric layers 120 and the mold sacrificial layers 110. Because, as discussed above, the first inactive pillars 155 have no etch selectivity or a low etch selectivity with respect to the mold dielectric layers 120 and the mold sacrificial layers 110, the first inactive pillars 155 may also be etched with the mold dielectric layers 120 and the mold sacrificial layers 110 of the first stack S1. In some embodiments, the first inactive pillars 155 may be etched at an etch rate the same as or similar to etch rates of the mold dielectric layers 120 and the mold sacrificial layers 110 of the first stack S1, and thus upper surfaces of the first inactive pillars 155 may be coplanar with upper surfaces of the mold dielectric layers 120, as illustrated in FIG. 2E.

In this description, a staircase process may refer to a series of trimming processes and etching processes. A single staircase process may use a single mask pattern (e.g., a mask pattern 60 in FIG. 2E) throughout the process, and the single mask pattern may be removed after the single staircase process is completed. In some example embodiments, a single staircase process may be performed to form the stair-step structure 300 continuously extending along the first and second stacks S1 and S2, as illustrated in FIG. 2E. For example, as discussed with reference to FIGS. 2B and 2C, because the first sacrificial pillars 150 on the extension region EXT are replaced with the first inactive pillars 155 including a material same as or similar to those of the mold dielectric layers 120 and the mold sacrificial layers 110, the etching process may be easily performed on the extension region EXT of the first stack S1. Accordingly, the stair-step structure 300 may be formed by performing a single staircase process on the first and second stacks S1 and S2, rather than performing two staircase processes separately on each of the first and second stacks S1 and S2. Even when two or more first stacks S1 are provided between the semiconductor substrate 100 and the second stack S2, the stair-step structure 300 may be formed by a single staircase process. After the stair-step structure 300 is formed, the mask pattern 60 may be removed by, for example, an ashing or strip process.

Figure 2F:
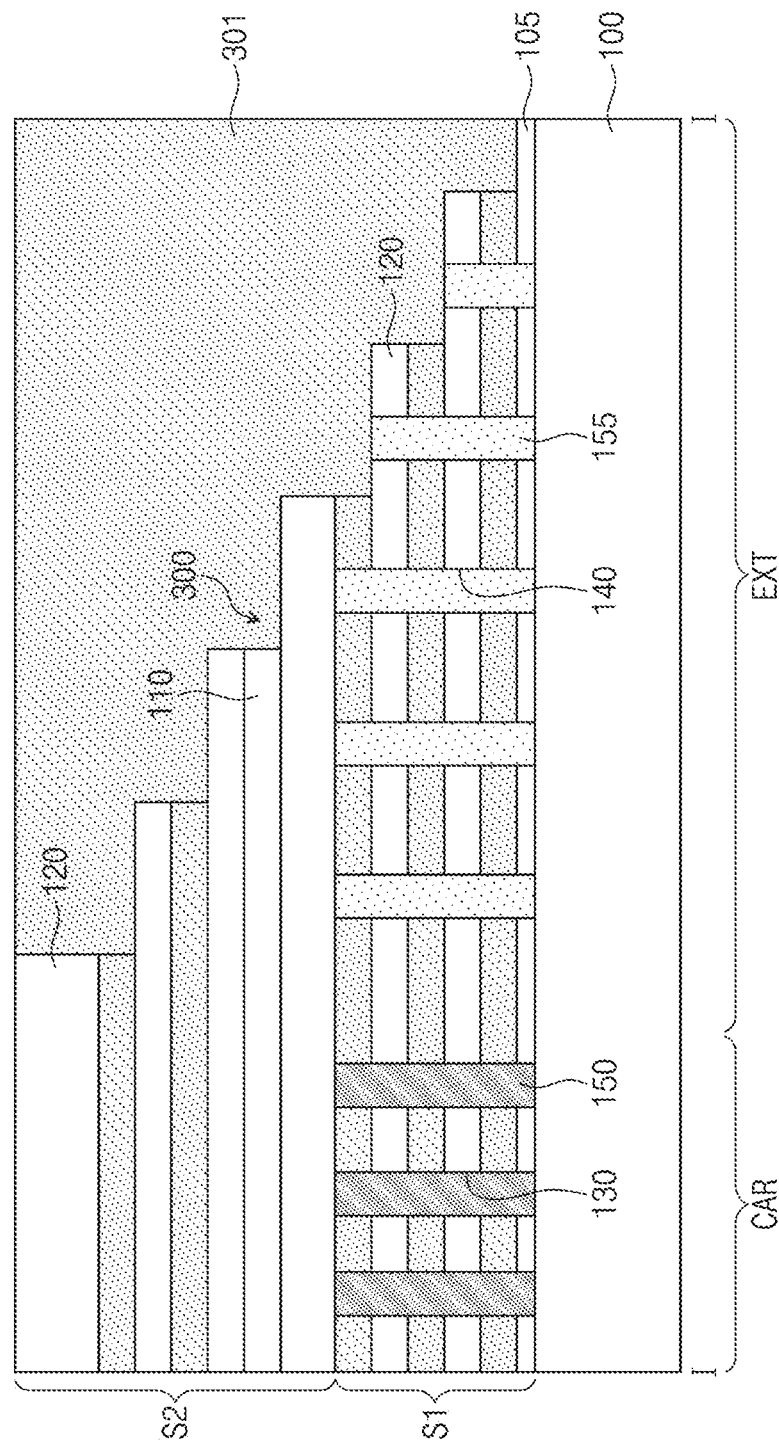

Referring to FIG. 2F, a planarized dielectric layer 301 may be formed on the semiconductor substrate 100, covering the stair-step structure 300. The planarized dielectric layer 301 may include, for example, silicon oxide, silicon nitride, or a combination thereof. The stair-step structure 300 may have a downward inclined shape that extends along a direction (corresponding to the first direction X of FIG. 1B) from the cell array region CAR toward the extension region EXT. On the extension region EXT, the mold sacrificial layers 110 may have their end portions that are not covered with next-overlying mold sacrificial layers 110. For example, on the extension region EXT, each of the mold sacrificial layers 110 may protrude beyond the end portion of the next-overlying mold sacrificial layer 110, as illustrated in FIG. 2F.

When the staircase process is performed, the etching process may etch top ends of ones of the first inactive pillars 155. The etched first inactive pillars 155 may have their heights less than initial heights thereof. The height may refer to a length in a vertical direction (corresponding to the third direction Z of FIG. 1B) from the semiconductor substrate 100. The heights of the etched first inactive pillars 155 may be reduced (e.g., gradually reduced) as a distance between the etched first inactive pillar 155 and the cell array region CAR in the first direction X increases, as illustrated in FIG. 2F. The first inactive pillars 155 not etched during the staircase process may maintain their initial heights. Similarly, the first sacrificial pillars 150 may maintain their initial heights.

Referring to FIGS. 2G_1 and 2G_2, second vertical holes 230 and second dummy vertical holes 240 may be formed. The second vertical holes 230 may be provided on the cell array region CAR, and the second dummy vertical holes 240 may be provided on the extension region EXT. For example, the second stack S2 may undergo an etching process to form the second vertical holes 230 that are vertically aligned with the first vertical holes 130. The second stack S2 and the planarized dielectric layer 301 may undergo an etching process to form the second dummy vertical holes 240 that are vertically aligned with the first dummy vertical holes 140. The second vertical holes 230 and the second dummy vertical holes 240 may be formed at the same time. The second vertical holes 230 and the second dummy vertical holes 240 may have a hollow pillar shape, such as a hollow circular pillar shape, a hollow oval pillar shape, or a hollow polygonal pillar shape. In some embodiments, the second vertical holes 230 and the second dummy vertical holes 240 may be formed concurrently.

In some embodiments, each of the second vertical holes 230 and the second dummy vertical holes 240 may have a side perpendicular to the upper surface of the semiconductor substrate 100 and may have a uniform width in the first direction X along the third direction Z, as illustrated in FIG. 2G_1. In some embodiments, each of the second vertical holes 230 and the second dummy vertical holes 240 may have a side slanted with respect to the upper surface of the semiconductor substrate 100 and may have a non-uniform width in the first direction X, which increases along the third direction Z, as illustrated in FIG. 2G_2.

The second vertical holes 230 and the second dummy vertical holes 240 may be formed to have their depths the same as or greater than a height of the second stack S2. For example, each of the second vertical holes 230 may penetrate (e.g., extend through) the second stack S2, and may be continuously connected to a respective one of the first vertical holes 130 beneath the second vertical holes 230. In such cases, each of the second vertical holes 230 may reveal (e.g., expose) a respective one of the first sacrificial pillars 150 in the first vertical hole 130 that correspond to the second vertical hole 230. Ones of the second dummy vertical holes 240 may penetrate the stair-step structure 300 of the second stack S2 and may be continuously connected to the first dummy vertical holes 140, respectively, beneath the ones of the second dummy vertical holes 240. In such cases, ones of the second dummy vertical holes 240 may reveal (e.g., expose) the first inactive pillars 155 in the first dummy vertical holes 140 that correspond to the ones of the second dummy vertical holes 240. Other ones of the second dummy vertical holes 240 may partially penetrate the planarized dielectric layer 301, and may not be continuously connected to the first dummy vertical holes 140 beneath the other ones of the second dummy vertical holes 240. In such cases, other ones of the second dummy vertical holes 240 may not reveal the first inactive pillars 155 in the first dummy vertical holes 140 that correspond to the other ones of the second dummy vertical holes 240.

In some embodiments, ones of the second dummy vertical holes 240 may extend through the second stack S2 and may expose underlying first inactive pillars 155, respectively, as illustrated in FIGS. 2G_1 and 2G_2. In some embodiments, ones of the second dummy vertical holes 240 may not extend through the planarized dielectric layer 301 and may be spaced apart from underlying first inactive pillars 155, respectively, in the third direction Z, as illustrated in FIGS. 2G_1 and 2G_2.

Figure 2H:
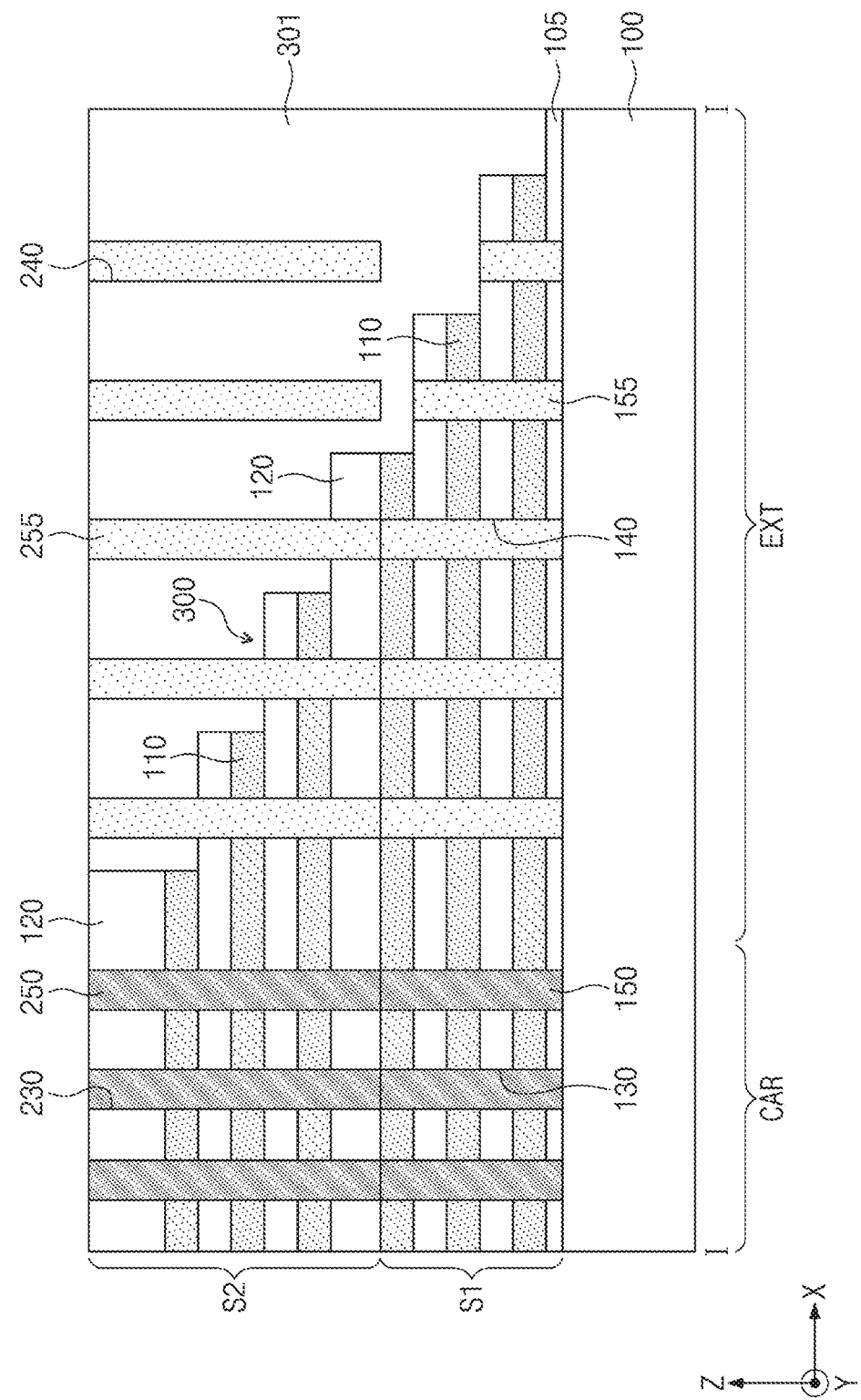
Figure 21:
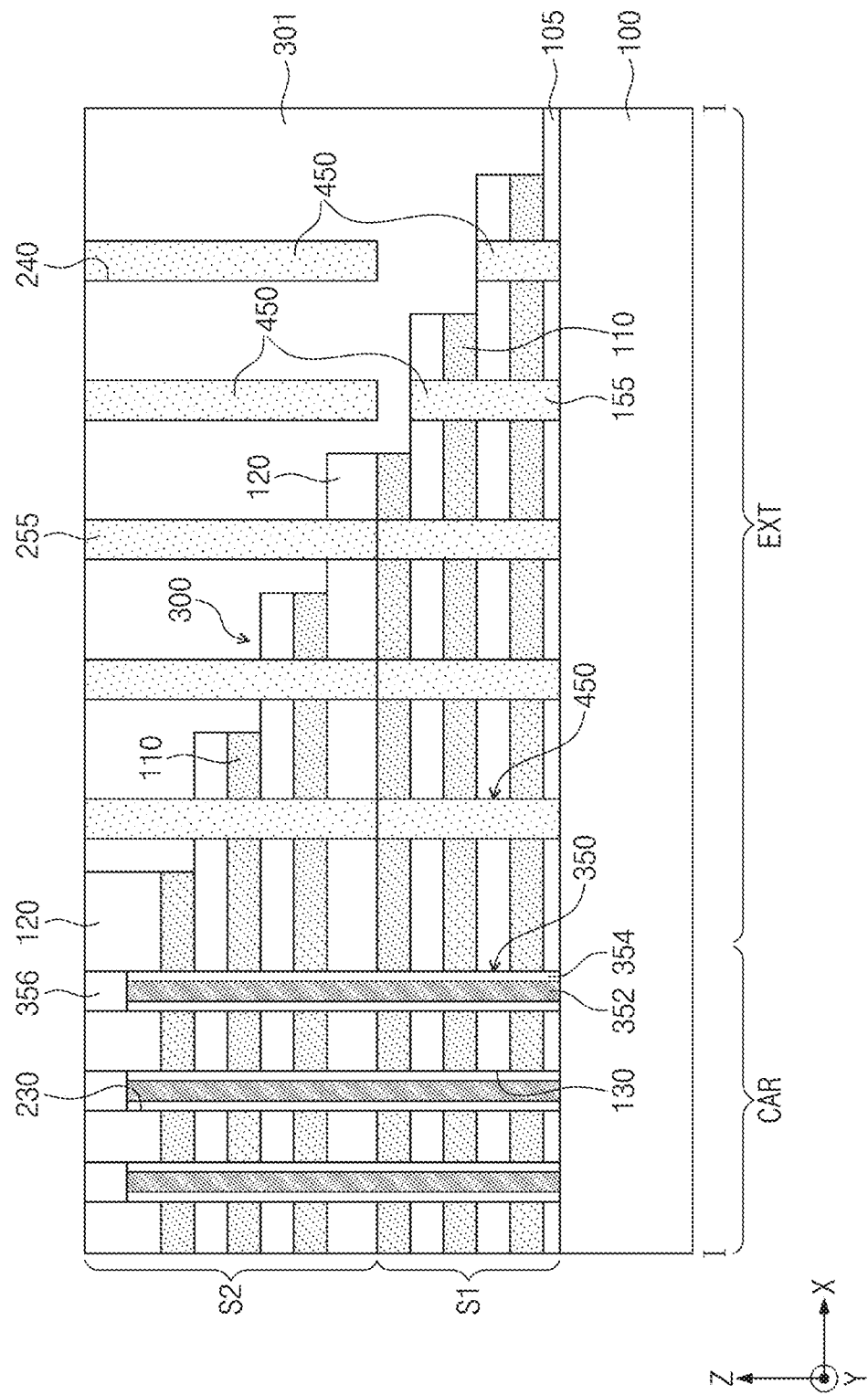

Referring to FIG. 2H, second sacrificial pillars 250 may be formed in the second vertical holes 230, and second inactive pillars 255 may be formed in the second dummy vertical holes 240. For example, the second sacrificial pillars 250 may be formed in both the second vertical holes 230 and in the second dummy vertical holes 240, and then an identical or similar process to that discussed with reference to FIG. 2C may be performed to form the second inactive pillars 255 that replace the second sacrificial pillars 250 in the second dummy vertical holes 240. The second sacrificial pillars 250 may include a material, for example, a semiconductor material such as polysilicon or a metallic material such as tungsten. In some embodiments, the second sacrificial pillars 250 may include a material that is the same as or similar to that of the first sacrificial pillars 150. The second inactive pillars 255 may include a material, such as silicon oxide, silicon nitride, or a combination thereof. In some embodiments, the second inactive pillars 255 may include a material that is the same as or similar to that of the first inactive pillars 155.

A continuous single body may be defined to include the first and second sacrificial pillars 150 and 250 in the first and second vertical holes 130 and 230 that are continuously connected to each other. Another continuous single body may be defined to include the first and second inactive pillars 155 and 255 in the first and second dummy vertical holes 140 and 240 that are continuously connected to each other. A discontinuous single body may be defined to include the first and second inactive pillars 155 and 255 in the first and second dummy vertical holes 140 and 240 that are not connected to each other. A one-to-one correspondence relation may be established between the first inactive pillars 155 and the second inactive pillars 255. For example, the number of the first inactive pillars 155 may be the same as the number of the second inactive pillars 255.

In some embodiments, each of the second sacrificial pillars 250 may overlap a respective one of the first sacrificial pillars 150 in the third direction Z, and each of the second inactive pillars 255 may overlap a respective one of the first inactive pillars 155 in the third direction Z, as illustrated in FIG. 2H. It will be understood that "an element A overlaps an element B in a direction" (or similar language) means that there is at least one line that extends in the direction and intersects both the elements A and B.

Referring to FIG. 2I, a plurality of vertical channels 350 may be formed to penetrate the first and second stacks S1 and S2 and to have electrical connection with the semiconductor substrate 100. For example, an etching process may be performed to selectively remove the first and second sacrificial pillars 150 and 250 from the first and second vertical holes 130 and 230, and then the vertical channels 350 may fill empty first and second vertical holes 130 and 230 from which the first and second sacrificial pillars 150 and 250 are removed. Because, as discussed above, the first and second sacrificial pillars 150 and 250 may include a material having an etch selectivity with respect to the mold sacrificial layers 110 and the mold dielectric layers 120, the first and second sacrificial pillars 150 and 250 may be selectively removed without etching loss of the mold sacrificial layers 110 and the mold dielectric layers 120.

Each of the vertical channels 350 may include a channel layer 352 and a memory layer 354 surrounding the channel layer 352. The memory layer 354 may include one or more dielectric layers. For example, the memory layer 354 may include a tunnel dielectric layer that surrounds the channel layer 352, a blocking dielectric layer that is far away from the memory layer 354, and a charge storage layer that is between the tunnel dielectric layer and the blocking dielectric layer. The channel layer 352 may include, for example, polysilicon. The channel layer 352 may have a bulk shape or a hollow pipe shape. When the channel layer 352 has a hollow pipe shape, a dielectric layer may fill an empty inside of the pipe shape. A pad 356 may be formed on a top end of each of the vertical channels 350. The pad 356 may be a conductor or a doping region into which impurities (e.g., N-type impurities) are implanted.

A pair of first and second inactive pillars 155 and 255 that are vertically aligned with each other may form a dummy vertical channel 450. For example, the vertical channels 350 may be provided on the cell array region CAR, and the dummy vertical channels 450 may be provided on the extension region EXT. Ones of the dummy vertical channels 450 each may be a continuous single body, and other ones of the dummy vertical channels 450 each may be a discontinuous single body. For example, at least one of the dummy vertical channels 450 that is adjacent to the cell array region CAR may be a continuous single body in which the first and second inactive pillars 155 and 255 are in physical contact with each other. In contrast, at least one of the dummy vertical channels 450 that is far away from the cell array region CAR may be a discontinuous single body in which the first and second inactive pillars 155 and 255 are physically spaced apart from each other. The dummy vertical channel 450 having such discontinuous single body may include an isolated inactive pillar (also referred to as a floating inactive pillar), or the second inactive pillar 255 spaced apart from the first inactive pillar 155 in the third direction Z. In some embodiments, the pair of first and second inactive pillars 155 and 255 that are farthest from the cell array region CAR may be spaced apart from each other in the third direction Z, as illustrated in FIG. 2I.

The first and second inactive pillars 155 and 255 may have the same dielectric bulk structure. In some embodiments, each of the first and second inactive pillars 155 and 255 may be a solid structure. In some embodiments, each of the first and second inactive pillars 155 and 255 may have a unitary structure that is formed of a single material layer (e.g., a single insulating layer) without interfaces therein.

Still referring to FIG. 2I, the second inactive pillars 255 may have a uniform height. In contrast, the first inactive pillars 155 may have non-uniform heights. For example, ones of the first inactive pillars 155 may have the same or similar height, and other ones of the first inactive pillars 155 may have heights that decrease (e.g., gradually decrease) as a distance between the first inactive pillars 155 and the cell array region CAR increases. The first inactive pillars 155 having the reduced heights may be spaced apart from corresponding second inactive pillars 255. A spacing distance between the first and second inactive pillars 155 and 255 in the third direction Z may increase as a distance between the first inactive pillars 155 and the cell array region CAR increases.

Ones of the second inactive pillars 255 may penetrate the planarized dielectric layer 301 and the stair-step structure 300, and other ones of the second inactive pillars 255 may penetrate the planarized dielectric layer 301 and not penetrate the stair-step structure 300. The second inactive pillars 255 penetrating the stair-step structure 300 may directly contact corresponding first inactive pillars 155. The second inactive pillars 255 not penetrating the stair-step structure 300 may be spaced apart from corresponding first inactive pillars 155.

Figure 2J:
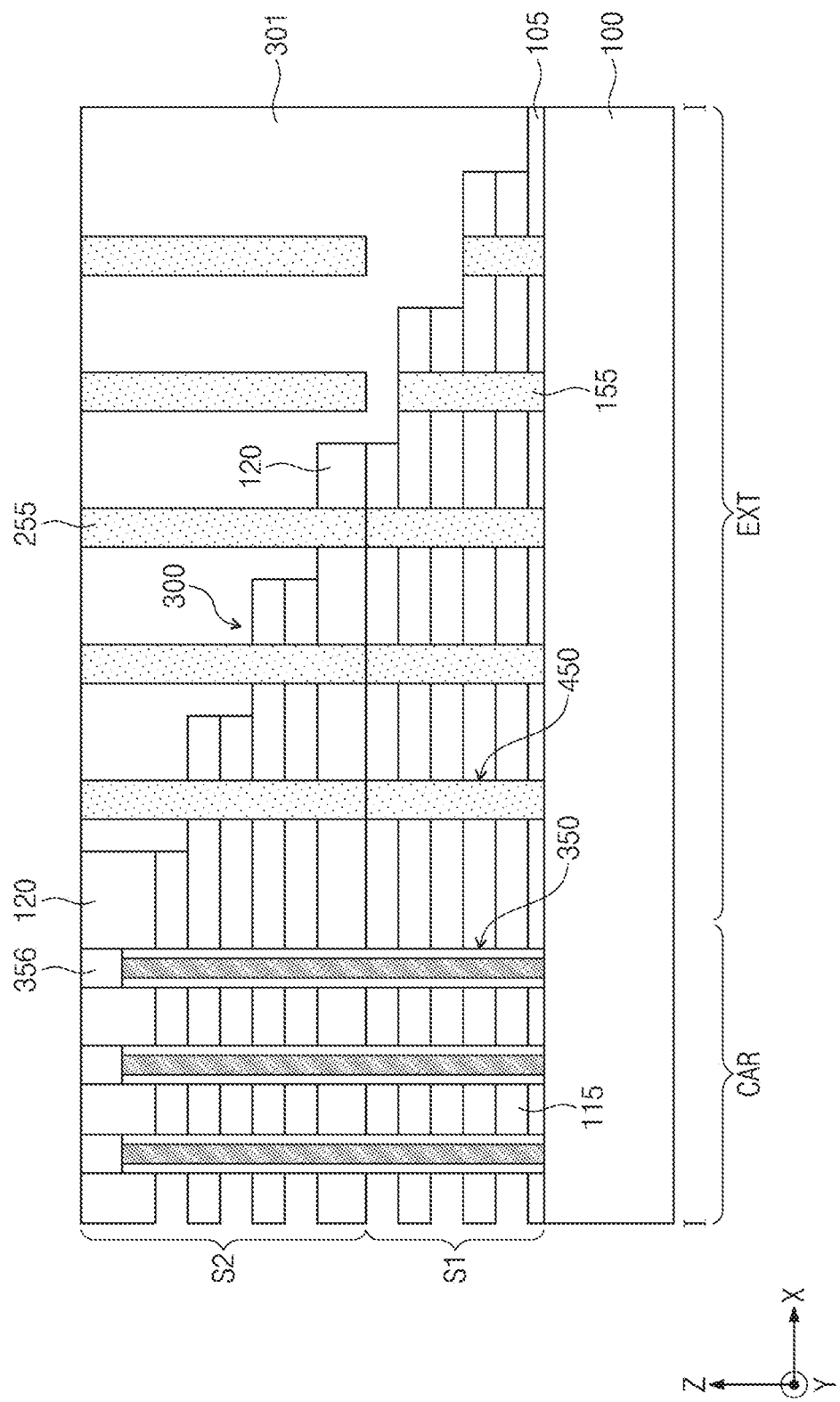

Referring to FIG. 2J, spaces 115 may be formed between the mold dielectric layers 120. For example, the mold sacrificial layers 110 may be removed by an etching process using an etchant that can selectively etch the mold sacrificial layers 110, which removal may form the spaces 115 between the mold dielectric layers 120. When the mold sacrificial layers 110 include silicon nitride, the mold sacrificial layers 110 may be selectively removed by an etchant that contains, for example, phosphoric acid ($H_3PO_4$). Although the first and second stacks S1 and S2 have weak points (e.g., portions vulnerable to such as sag or collapse) resulting from the formation of the spaces 115 between the mold dielectric layers 120, the dummy vertical channels 450 may serve as supporters to overcome the weak points.

Figure 2K:
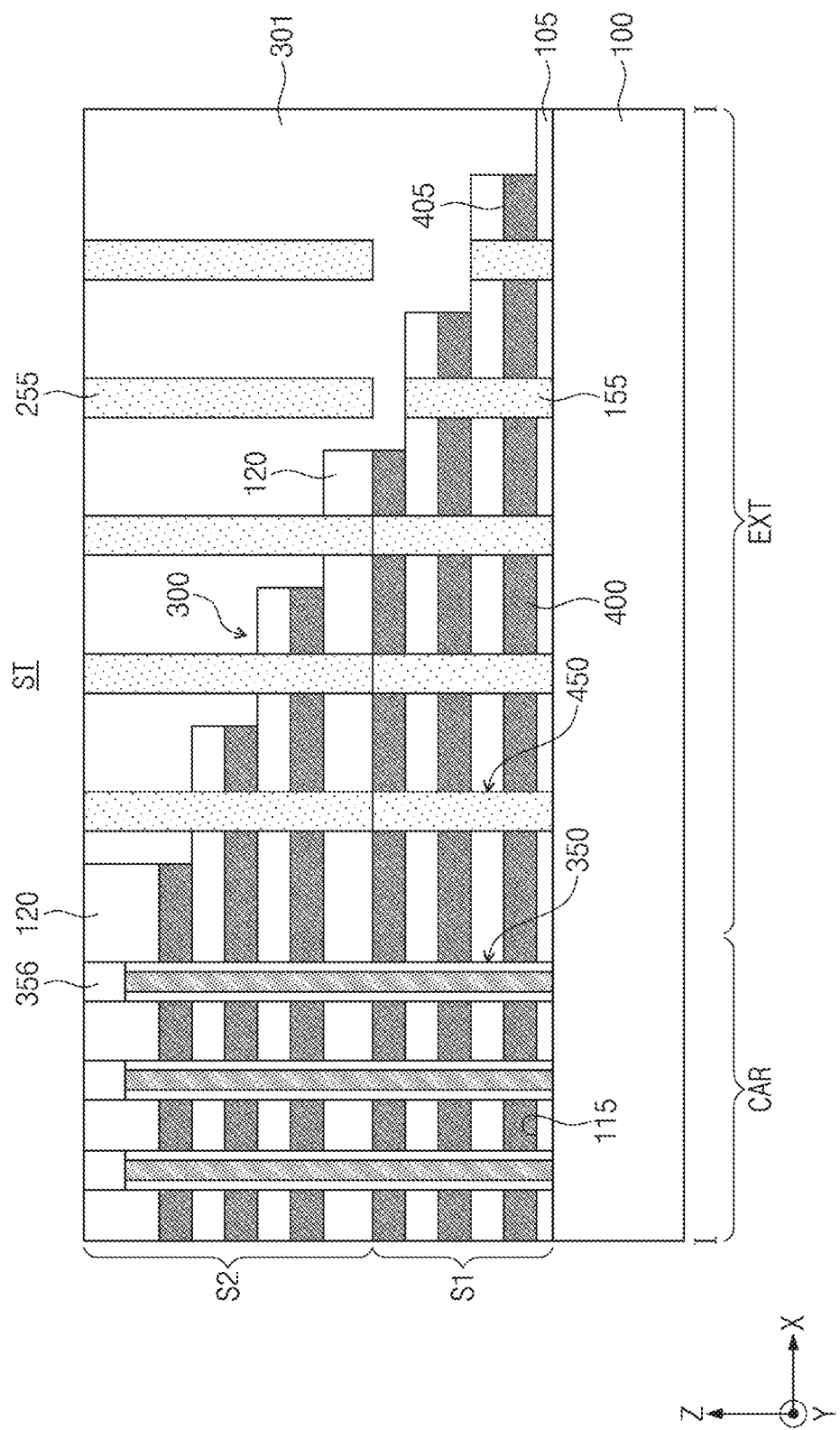

Referring to FIG. 2K, electrodes 400 may be formed between the mold dielectric layers 120, and thus a stack structure ST may be formed. For example, a conductive material may be deposited to form the electrodes 400 that fill the spaces 115. The electrodes 400 may include, for example, polysilicon or metal. For example, the electrodes 400 may include tungsten. When a process is performed to fill the spaces 115 with the electrodes 400, the dummy vertical channels 450 may support the stair-step structure 300, and the first and second stacks S1 and S2 may not collapse.

Each of the electrodes 400 may be one of the ground select line GSL, the word lines WL0 to WL3, and the string select line SSL shown in FIG. 1A. Each of the electrodes 400 may include a pad 405, or an end portion thereof, provided on the extension region EXT. The pads 405 of the electrodes 400 may form the stair-step structure 300 on the extension region EXT and may be supported by the dummy vertical channels 450.

As shown in FIG. 1B, a common source 672 may be formed by implanting impurities (e.g., N-type impurities) into the semiconductor substrate 100 between neighboring stack structures ST, and a common source plug 676 may be formed to have electrical connection with the common source 672 and to extend along the common source 672 between the stack structures ST.

Figure 2L:
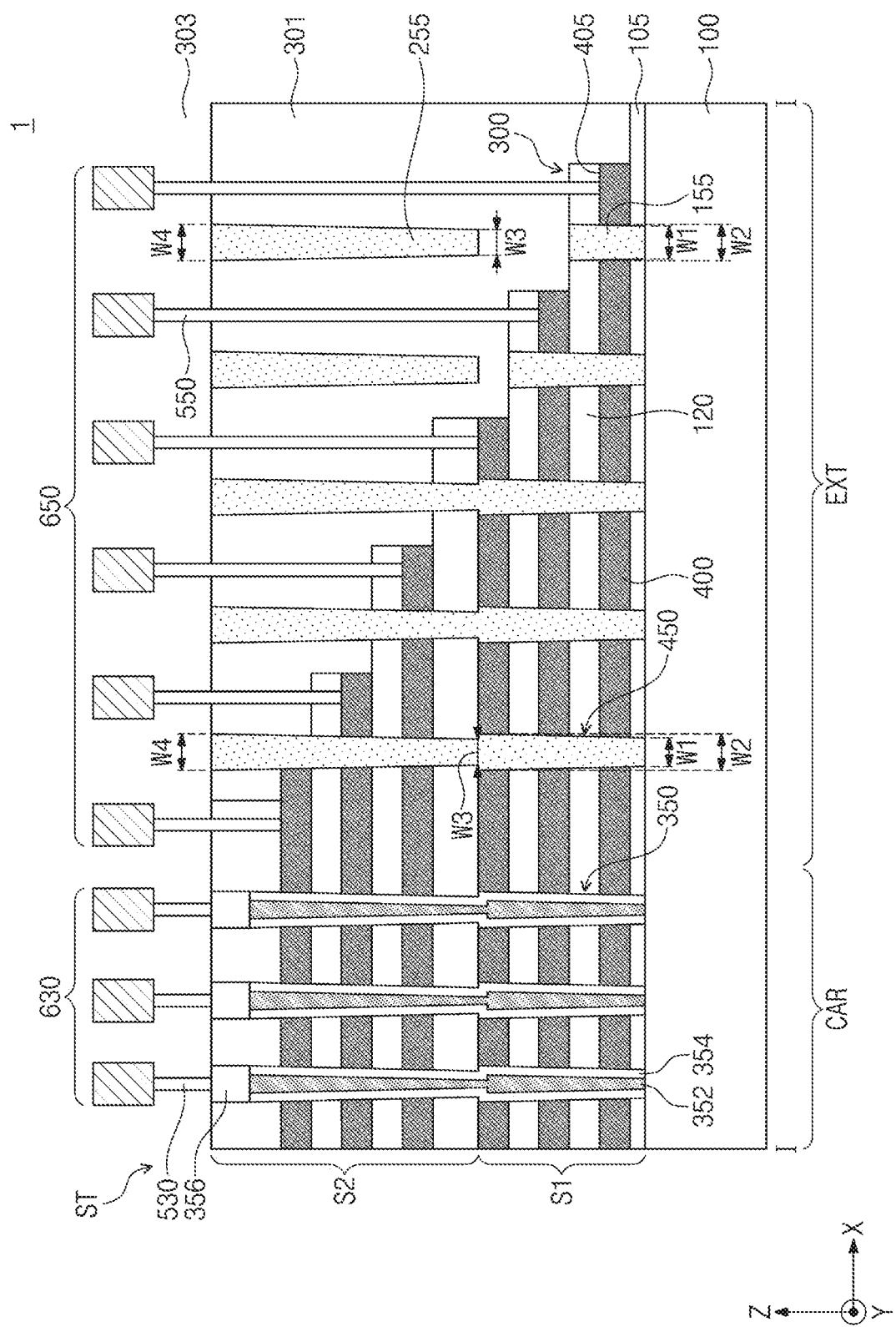

Referring to FIG. 2L, bit lines 630 may be formed on the cell array region CAR, and metal lines 650 may be formed on the extension region EXT. For example, an interlayer dielectric layer 303 may be formed on the semiconductor substrate 100 and may cover the second stack S2 and the planarized dielectric layer 301. The interlayer dielectric layer 303 may be formed by depositing, for example, silicon oxide, silicon nitride, or a combination thereof. On the cell array region CAR, bit line contacts 530 may be formed to penetrate the interlayer dielectric layer 303 and to have connection with the pads 356. On the extension region EXT, metal contacts 550 may be formed to penetrate the interlayer dielectric layer 303 and the planarized dielectric layer 301 and to have connection with the pads 405 of the electrodes 400. The metal contacts 550 may further penetrate the mold dielectric layers 120 on the pads 405 of the electrodes 400. A conductive material may be deposited and patterned to form the bit lines 630 and the metal lines 650 on the interlayer dielectric layer 303. The bit lines 630 may be electrically connected through the bit line contacts 530 to the vertical channels 350. The metal lines 650 may be electrically connected through the metal contacts 550 to the pads 405 of the electrodes 400. Through the processes mentioned above, a three-dimensional semiconductor memory device 1 may be fabricated.

The first inactive pillar 155 has a lower portion adjacent the semiconductor substrate 100 and an upper portion opposite the lower portion thereof. In some embodiments, the lower portion of the first inactive pillar 155 has a first width W1 in the first direction X, and the upper portion of the first inactive pillar 155 has a second width W2 in the first direction X, which is greater than the first width W1, as illustrated in FIG. 2L. The second inactive pillar 255 has a lower portion adjacent the first inactive pillar 155 and an upper portion opposite the lower portion thereof. In some embodiments, the lower portion of the second inactive pillar 255 has a third width W3 in the first direction X, and the upper portion of the second inactive pillar 255 has a fourth width W4 in the first direction X, which is greater than the fourth width W4, as illustrated in FIG. 2L. In some embodiments, the second width W2 of the first inactive pillar 155 may be greater than the third width W3 of the second inactive pillar 255.

FIGS. 2M to 2Q illustrate cross-sectional views taken along the line I-I of FIG. 1B, and each of FIGS. 2M to 2Q shows different examples of the three-dimensional semiconductor memory device 1.

Figure 2M:
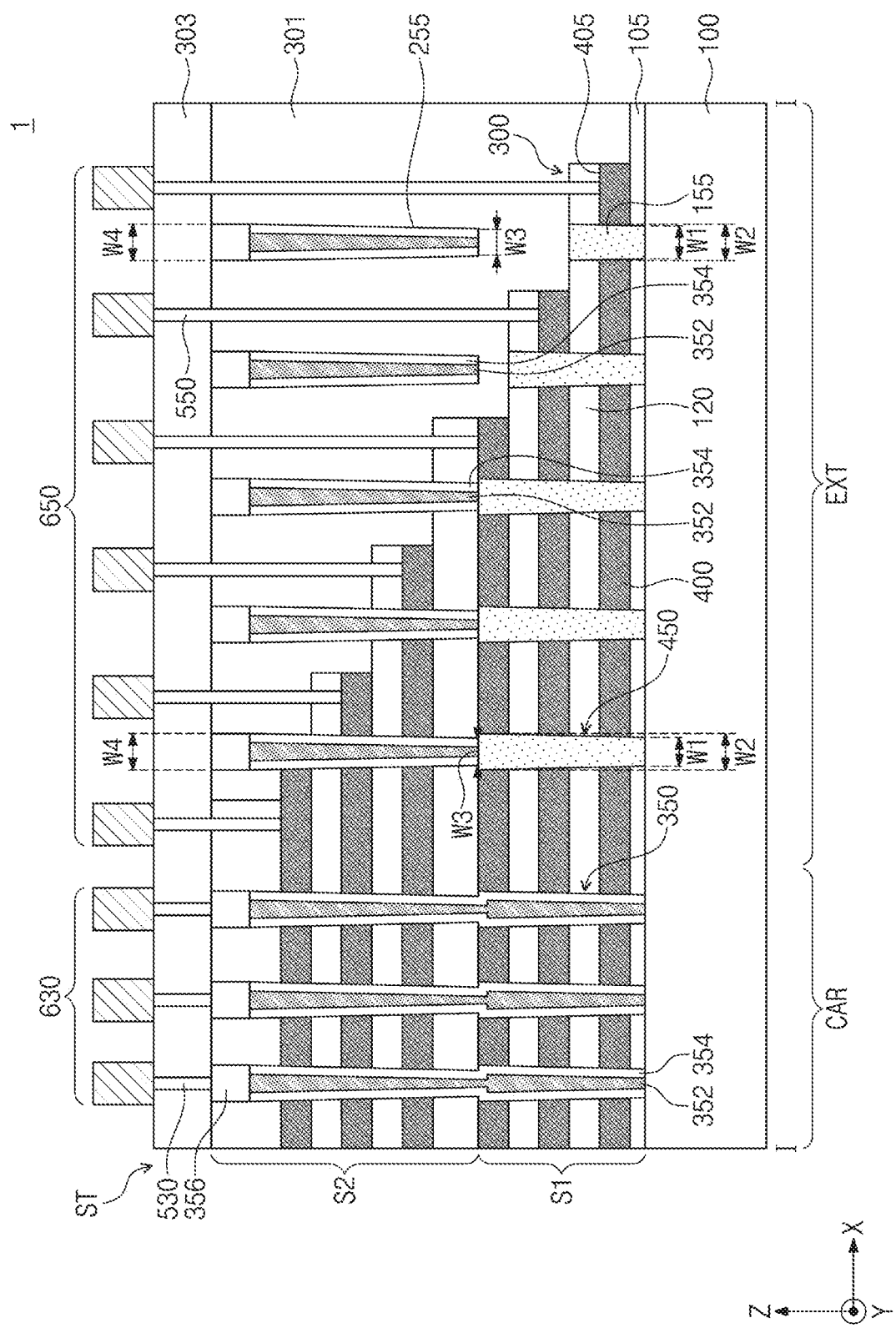
Figure 20:
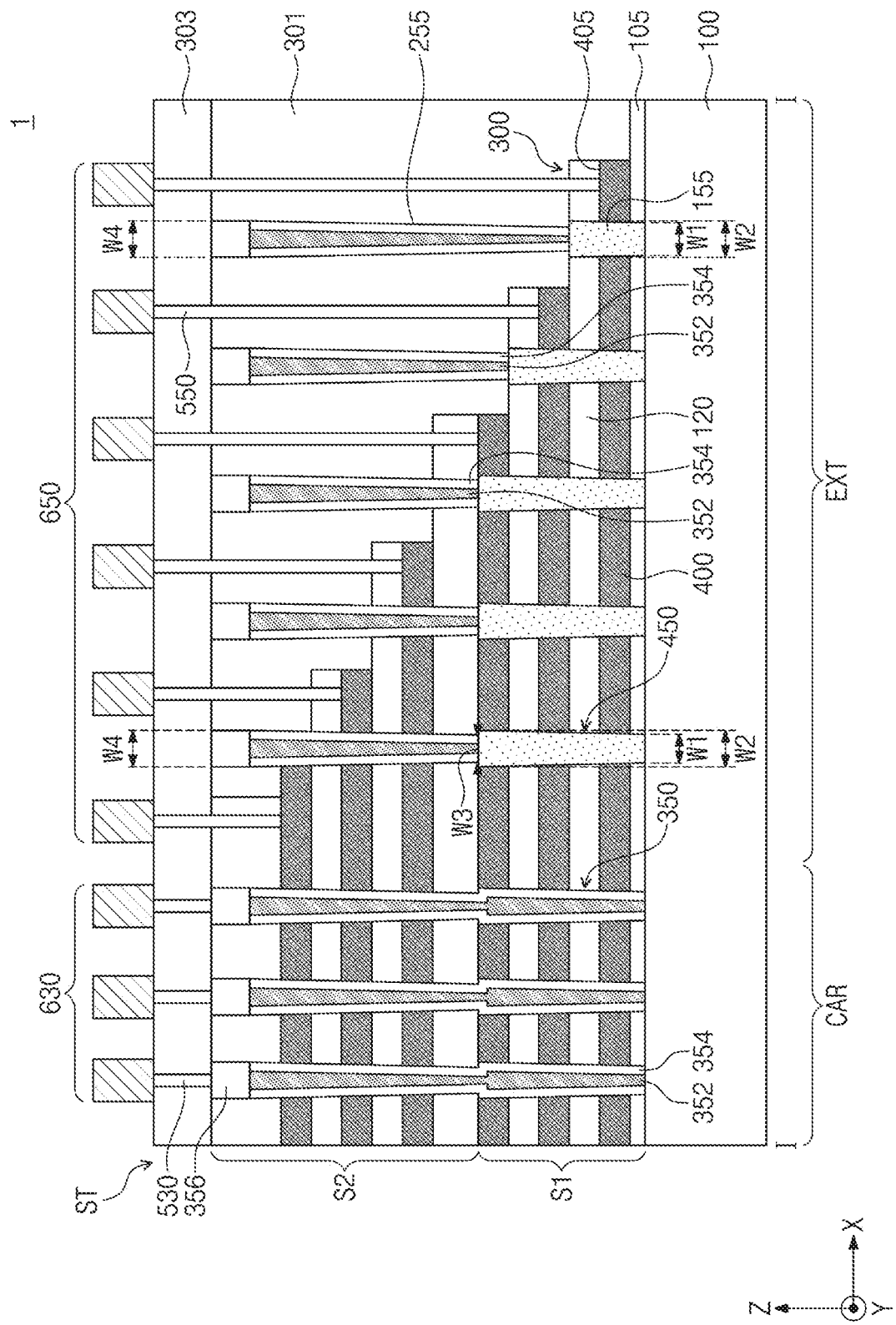

Referring to FIG. 2M, when the vertical channels 350 are formed on the cell array region CAR by the processes illustrated in FIGS. 2G to 2I, the second dummy vertical holes 240 may be filled with the second inactive pillars 255 each having an identical or similar structure to that of the vertical channels 350. The three-dimensional semiconductor memory device 1 may thus include the dummy vertical channels 450 each having a heterogeneous structure. For example, the first inactive pillars 155 may have a dielectric bulk structure, and the second inactive pillars 255 may have the same structure as that of the vertical channels 350. In some embodiments, the second inactive pillars 255 may include a material different from the first inactive pillars 155. In some embodiments, the first inactive pillars 155 may be formed before the second inactive pillars 255 are formed as discussed with reference to FIGS. 2C and 2H, and it will be understood that the first inactive pillars 155 and the second inactive pillars 255 may be formed by different processes.

In some embodiments, a channel layer 352 and a memory layer 354 may be formed in each of the second dummy vertical holes 240, as illustrated in FIG. 2M. In some embodiments, the channel layer 352 and the memory layer 354 formed in the second dummy vertical hole 240 that is farthest from the cell array region CAR may be spaced apart from both the underlying first inactive pillar 155 and the semiconductor substrate 100 in the third direction Z, as illustrated in FIG. 2M. In contrast, the channel layer 352 of the vertical channel 350 on the cell array region CAR may directly contact the semiconductor substrate 100. In some embodiments, the channel layer 352 and the memory layer 354 formed in the second dummy vertical hole 240 that is second farthest from the cell array region CAR may also be spaced apart from both the underlying first inactive pillar 155 and the semiconductor substrate 100 in the third direction Z, as illustrated in FIG. 2M. In some embodiments, the first inactive pillars 155 may not include a channel layer 352.

Referring to FIG. 2N, when the second vertical holes 230 and the second dummy vertical holes 240 are formed by the process illustrated in FIGS. 2G_1 and 2G_2, all of the second dummy vertical holes 240 may be formed to have their depths that are sufficient enough to expose the first inactive pillars 155 beneath corresponding second dummy vertical holes 240. In such cases, the second inactive pillars 255 may directly contact the first inactive pillars 155, while having a dielectric bulk structure the same as or similar to that of the first inactive pillars 155. The three-dimensional semiconductor memory device 1 may then include the dummy vertical channels 450 each having a continuous single body in which the first and second inactive pillars 155 and 255 are in direct contact with each other.

Referring to FIG. 2O, as discussed with reference to FIG. 2M, the second dummy vertical holes 240 may be filled with the second inactive pillars 255 each having an identical or similar structure to that of the vertical channels 350. The three-dimensional semiconductor memory device 1 may then include the dummy vertical channels 450 each having both a heterogeneous structure and a continuous single body in which the first and second inactive pillars 155 and 255 are in direct contact with each other.

In some embodiments, a channel layer 352 and a memory layer 354 may be formed in each of the second dummy vertical holes 240, as illustrated in FIG. 2O. In some embodiments, the channel layer 352 formed in the second dummy vertical hole 240 that is farthest from the cell array region CAR may include a lowermost end at a first level, and the channel layer 352 formed in the second dummy vertical hole 240 that is second farthest from the cell array region CAR may include a lowermost end at a second level that is higher than the first level, as illustrated in FIG. 2O. In some embodiments, an uppermost end of the channel layer 352 formed in the second dummy vertical hole 240 that is farthest from the cell array region CAR and an uppermost end of the channel layer 352 formed in the second dummy vertical hole 240 that is second farthest from the cell array region CAR may be at an equal level, as illustrated in FIG. 2O.

Figure 2P:
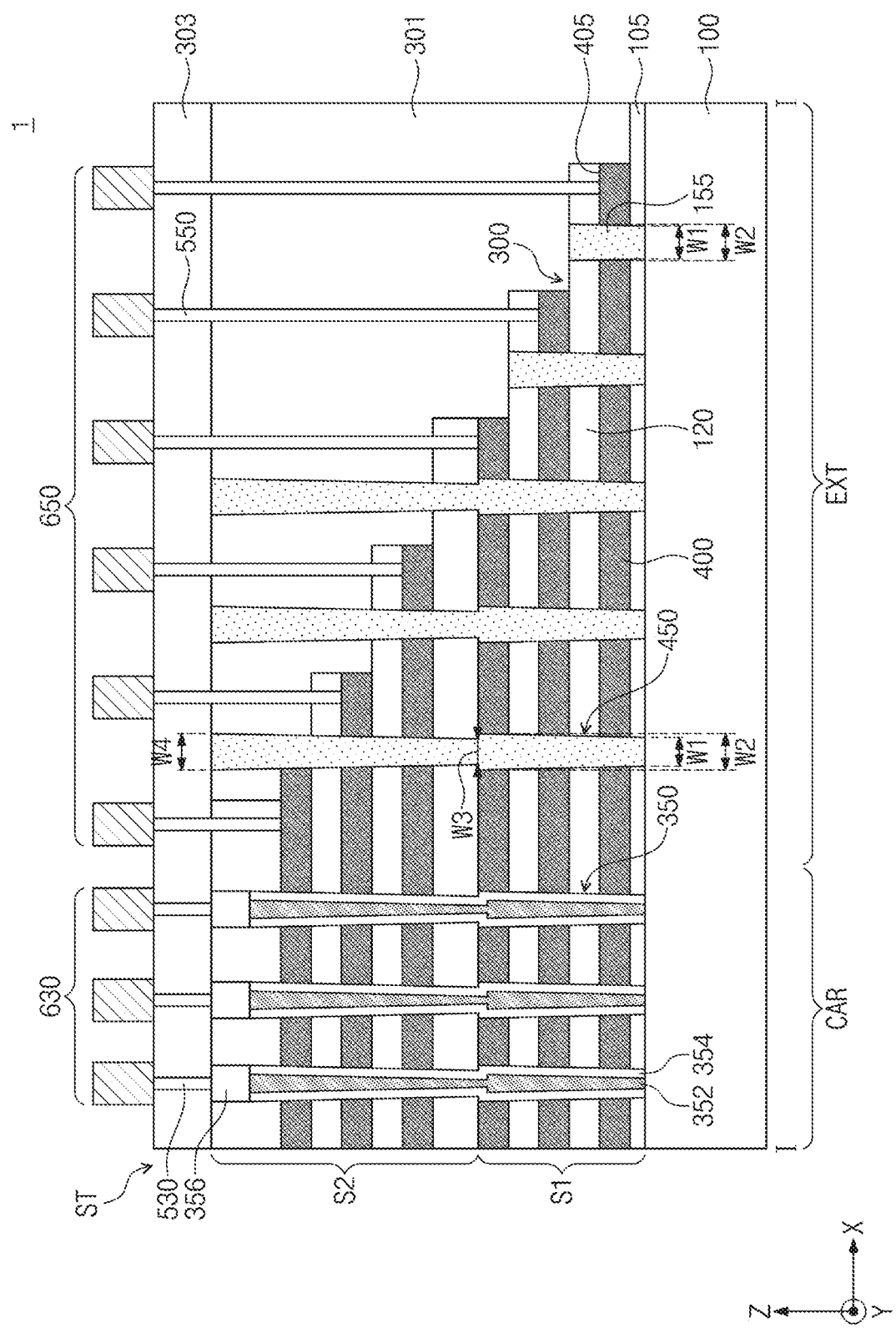

Referring to FIG. 2P, the three-dimensional semiconductor memory device 1 may include the dummy vertical channels 450, and the number of the first inactive pillars 155 constituting the dummy vertical channels 450 may be less than the number of the second inactive pillars 255 constituting the dummy vertical channels 450. A difference in the number may cause that at least one of the dummy vertical channels 450 may have a double or multiple pillar structure, and at least one of the dummy vertical channels 450 may have a single pillar structure.

For example, when the second dummy vertical holes 240 are formed by the process discussed with reference to FIGS. 2G_1 and 2G_2, no second dummy vertical holes 240 that penetrate only the planarized dielectric layer 301 and do not penetrate the stair-step structure 300 of the second stack S2 may be formed. Therefore, at least one of the dummy vertical channels 450 may have a double pillar structure in which the first and second inactive pillars 155 and 255 are continuously connected to each other, and at least one of the dummy vertical channels 450 may have a single pillar structure that includes only the first inactive pillar 155 and does not include the second inactive pillar 255. Each of the first and second inactive pillars 155 and 255 may have a dielectric bulk structure.

Figure 2Q:
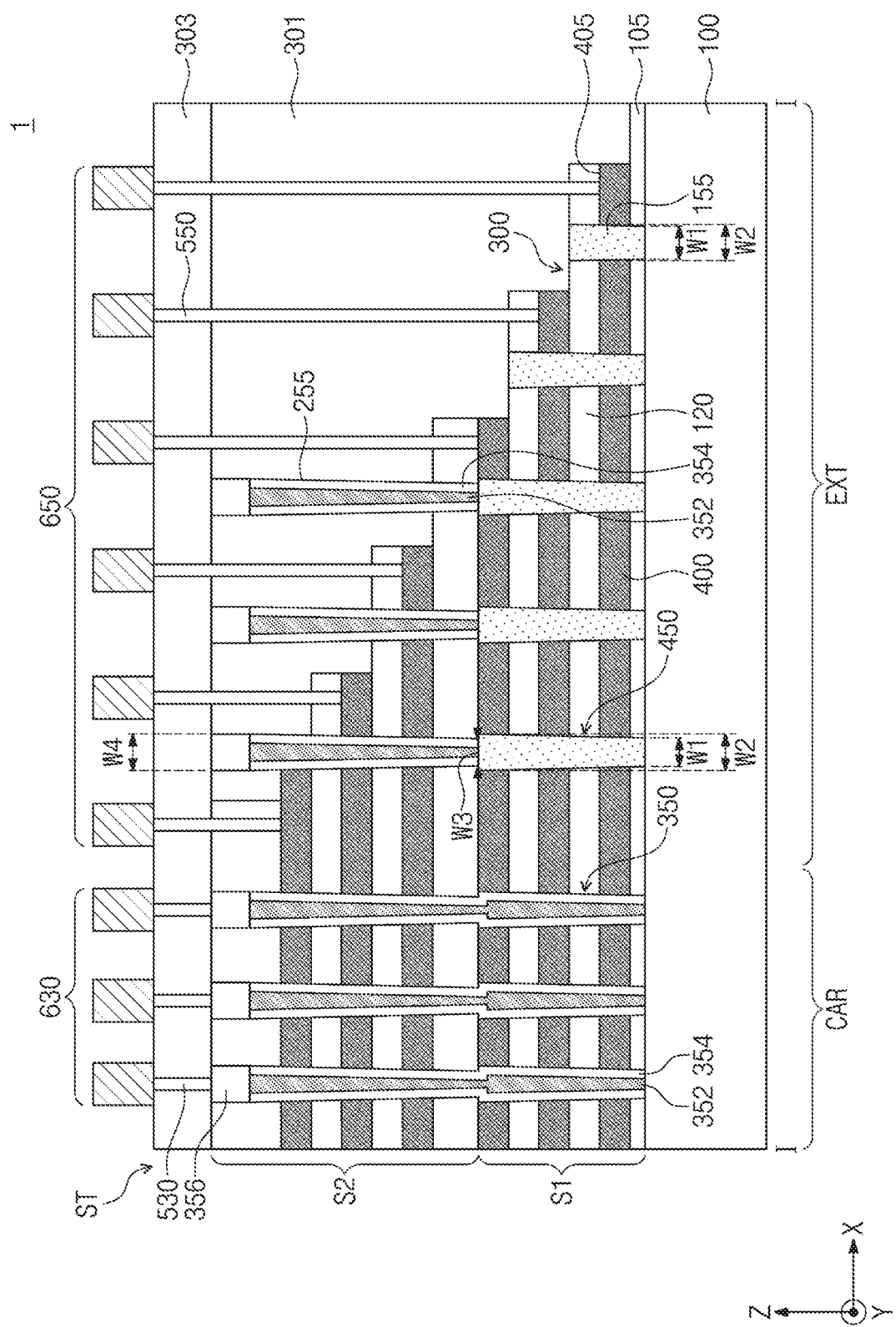

Referring to FIG. 2Q, identical or similar to that shown in FIG. 2P, the three-dimensional semiconductor memory device 1 may include at least one dummy vertical channel 450 having a double pillar structure and at least one dummy vertical channel 450 having a single pillar structure. The dummy vertical channel 450 having a double pillar structure may include the first inactive pillar 155 having a dielectric bulk structure and may also include the second inactive pillar 255 of the same structure as that of the vertical channel 350. The dummy vertical channel 450 having a single pillar structure may include a single first inactive pillar 155 having a dielectric bulk structure.

FIGS. 3A to 3D illustrate cross-sectional views taken along the line I-I of FIG. 1B showing a method of fabricating a three-dimensional semiconductor memory device according to some example embodiments of the present inventive concepts.

Figure 3A:
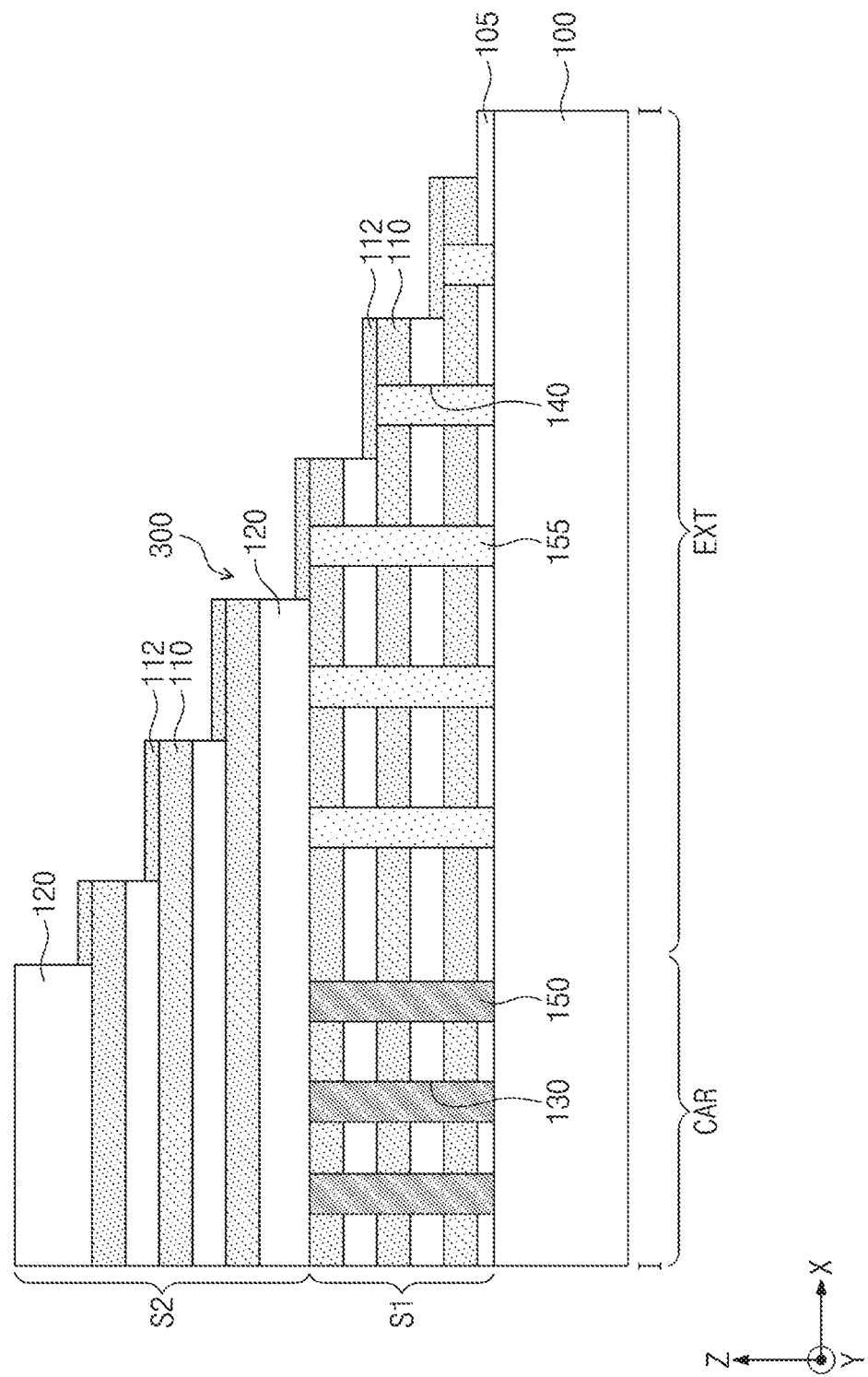
FIGS. 3A to 3D illustrate cross-sectional views taken along the line I-I of FIG. 1B showing a method of fabricating a three-dimensional semiconductor memory device according to some example embodiments of the present inventive concepts.

Referring to FIG. 3A, additional mold sacrificial layers 112 may be further formed on the stair-step structure 300. For example, processes that are identical or similar to those discussed with reference to FIGS. 2A to 2D may be performed to form the first and second stacks S1 and S2 on the semiconductor substrate 100, and then a staircase process that is identical or similar to that discussed with reference to FIG. 2E may be performed to pattern the first and second stacks S1 and S2, which may form the stair-step structure 300. In some example embodiments, when the staircase process is performed, etching targets may be controlled to form the stair-step structure 300 in which end portions of the mold sacrificial layers 110 are exposed on the extension region EXT. The additional mold sacrificial layers 112 may cover the exposed end portions of the mold sacrificial layers 110, respectively, as illustrated in FIG. 3A.

The additional mold sacrificial layers 112 may include a material the same as or similar to that of the mold sacrificial layers 110. For example, the additional mold sacrificial layers 112 may include, for example, silicon nitride. In some example embodiments, because the stair-step structure 300 is formed by the staircase process performed once, it may not be required that the formation of the additional mold sacrificial layers 112 on the first stack S1 be performed separately from the formation of the additional mold sacrificial layers 112 on the second stack S2. Accordingly, the additional mold sacrificial layers 112 covering the stair-step structure 300 may be formed by a single process (e.g., a single deposition process) performed on the first and second stacks S1 and S2.

Figure 3B:
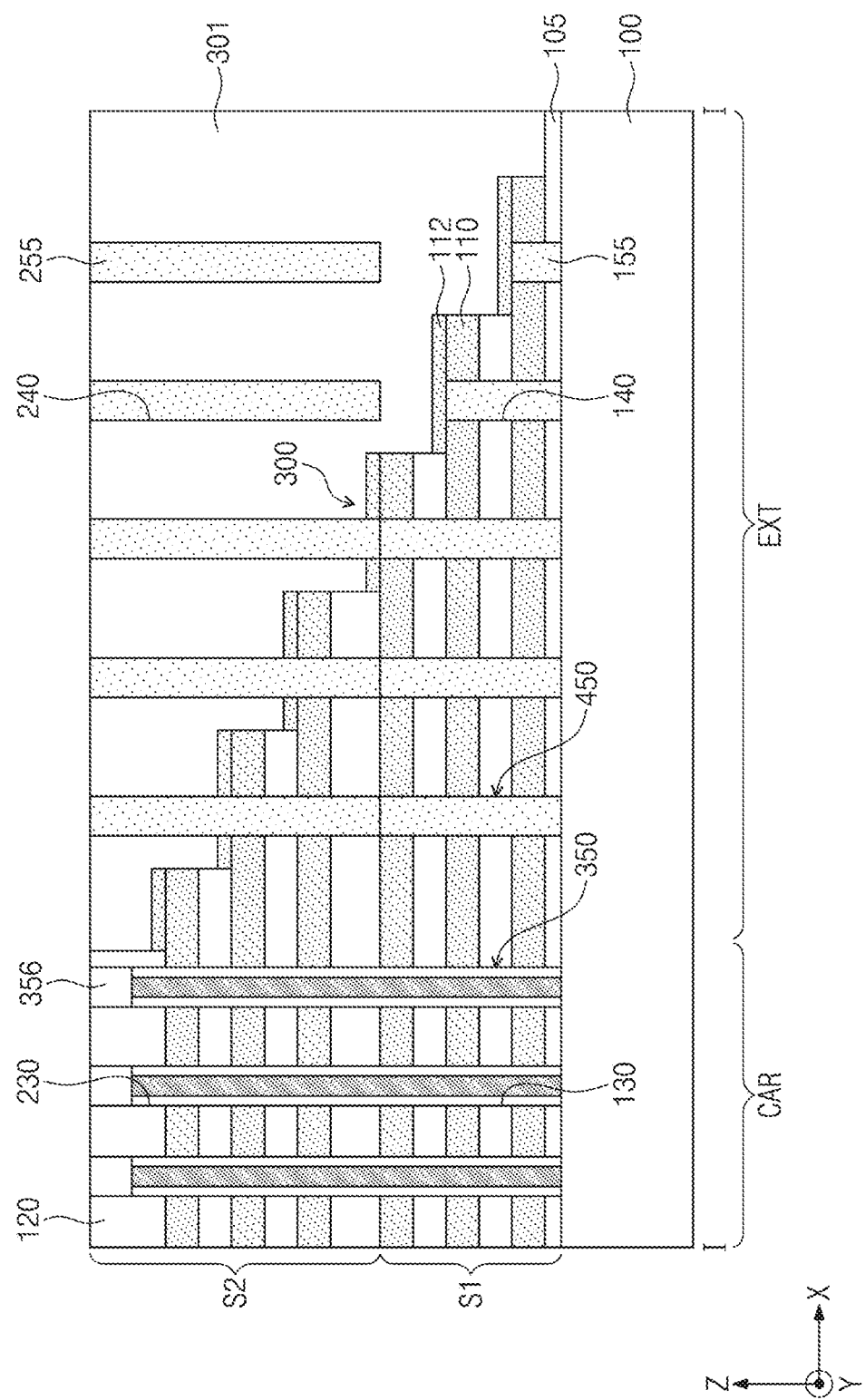

Referring to FIG. 3B, processes that are identical or similar to those discussed with reference to FIGS. 2F to 2I may be performed to form the planarized dielectric layer 301 covering the stair-step structure 300 and to form the vertical channels 350 and the dummy vertical channels 450 on the cell array region CAR and the extension region EXT. At least one of the dummy vertical channels 450 that is adjacent to the cell array region CAR may have a continuous single body in which the first and second inactive pillars 155 and 255 are in direct contact with each other, and at least one of the dummy vertical channels 450 that is far away from the cell array region CAR may have a discontinuous single body in which the first and second inactive pillars 155 and 255 are spaced apart from each other in the third direction Z. The first and second inactive pillars 155 and 255 may have the same dielectric bulk structure.

Figure 3C:
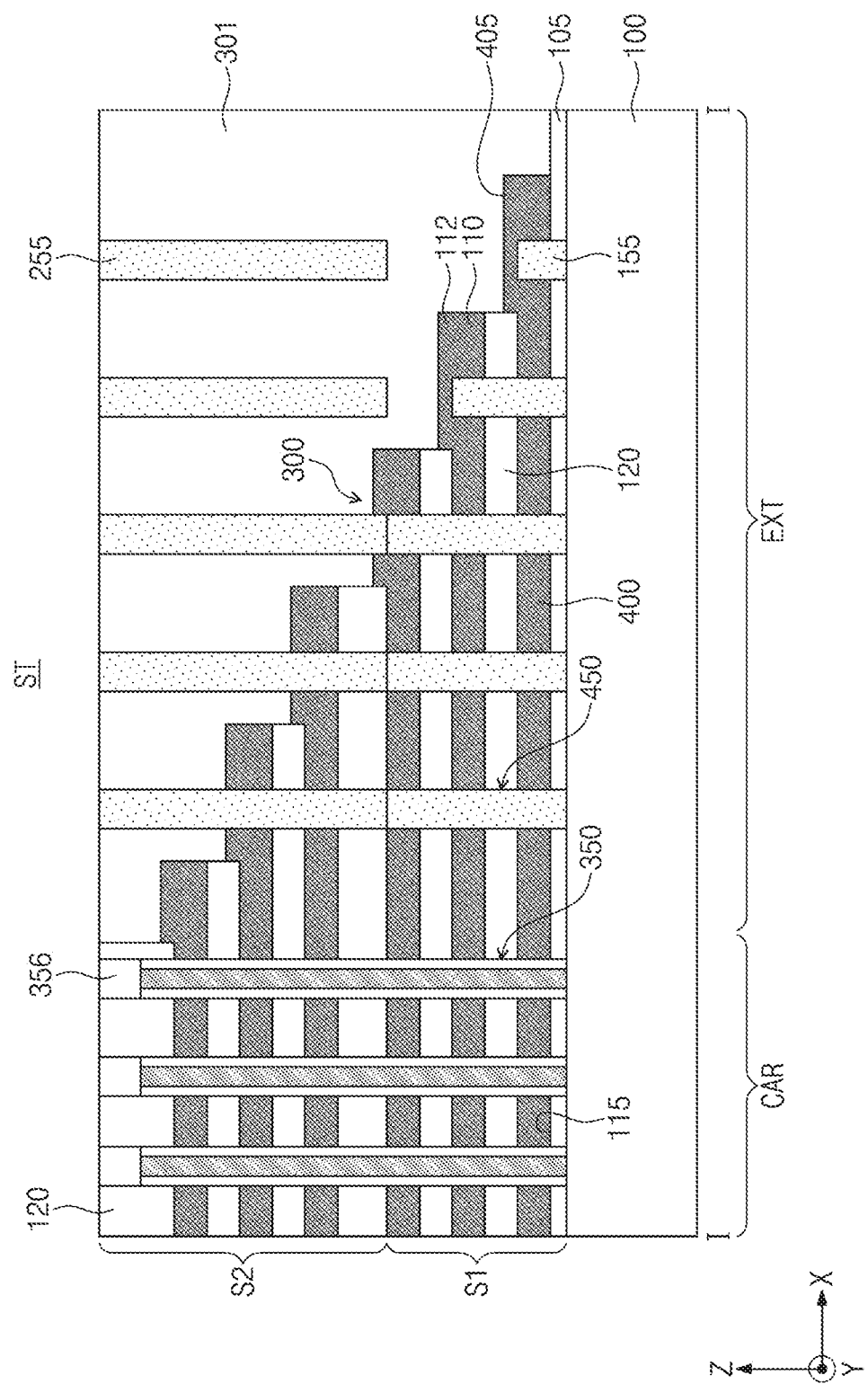

Referring to FIG. 3C, processes that are identical or similar to those discussed with reference to FIGS. 2J and 2K may be performed. The mold sacrificial layers 110 may be selectively removed to form the spaces 115, and the electrodes 400 may be formed to fill the spaces 115. Because the additional mold sacrificial layers 112 include a material the same as or similar to that of the mold sacrificial layers 110, the additional mold sacrificial layers 112 may also be removed with the mold sacrificial layers 110. Because, as discussed with reference to FIG. 3A, the additional mold sacrificial layers 112 are formed on end portions of the mold sacrificial layers 110, the spaces 115 may have expanded end portions corresponding to the end portions of the mold sacrificial layers 110. The pads 405 of the electrodes 400 may thus have an increased thickness. For example, the pad 405 may have a raised top surface compared to other portions of the electrode 400, as illustrated in FIG. 3C.

Figure 3D:
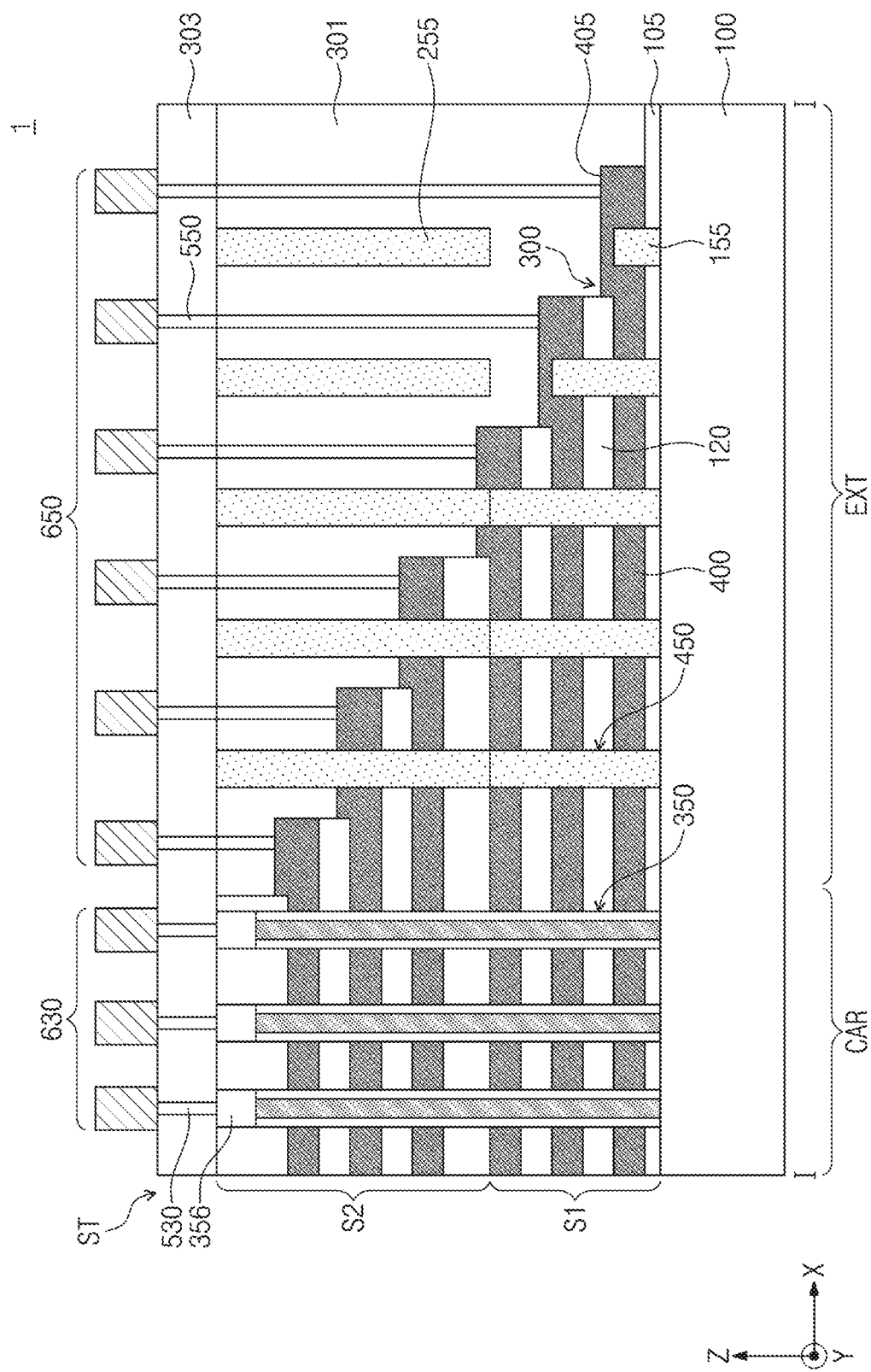

Referring to FIG. 3D, processes that are identical or similar to those discussed with reference to FIG. 2L may be performed to form the bit lines 630 that are electrically connected to the vertical channels 350 through the bit line contacts 530 that penetrate the interlayer dielectric layer 303. In addition, the processes may form the metal lines 650 that are electrically connected to the pads 405 of the electrodes 400 through the metal contacts 550 that penetrate the interlayer dielectric layer 303. Because the pads 405 of the electrodes 400 have an increased thickness, the pads 405 may have improved resistance to over-etching when an etching process is performed to form contact holes in which the metal contacts 550 are formed. The contact holes may thus be prevented both from penetrating corresponding pads 405 and from extending to other pads 405 immediately beneath the penetrated pads 405.

The dummy vertical channels 450 may have the same structure as that of the dummy vertical channels 450 shown in FIGS. 2M to 2Q. For example, the dummy vertical channels 450 may have a heterogeneous structure shown in FIG. 2M, a continuous single body shown in FIG. 2N, or both a heterogeneous structure and a continuous single body shown in FIG. 2O. In some embodiments, at least one of the dummy vertical channels 450 may have a single pillar structure shown in FIG. 2P or 2Q.

FIGS. 4A to 4F illustrate cross-sectional views taken along the line I-I of FIG. 1B showing a method of fabricating a three-dimensional semiconductor memory device according to some example embodiments of the present inventive concepts.

Figure 4A:
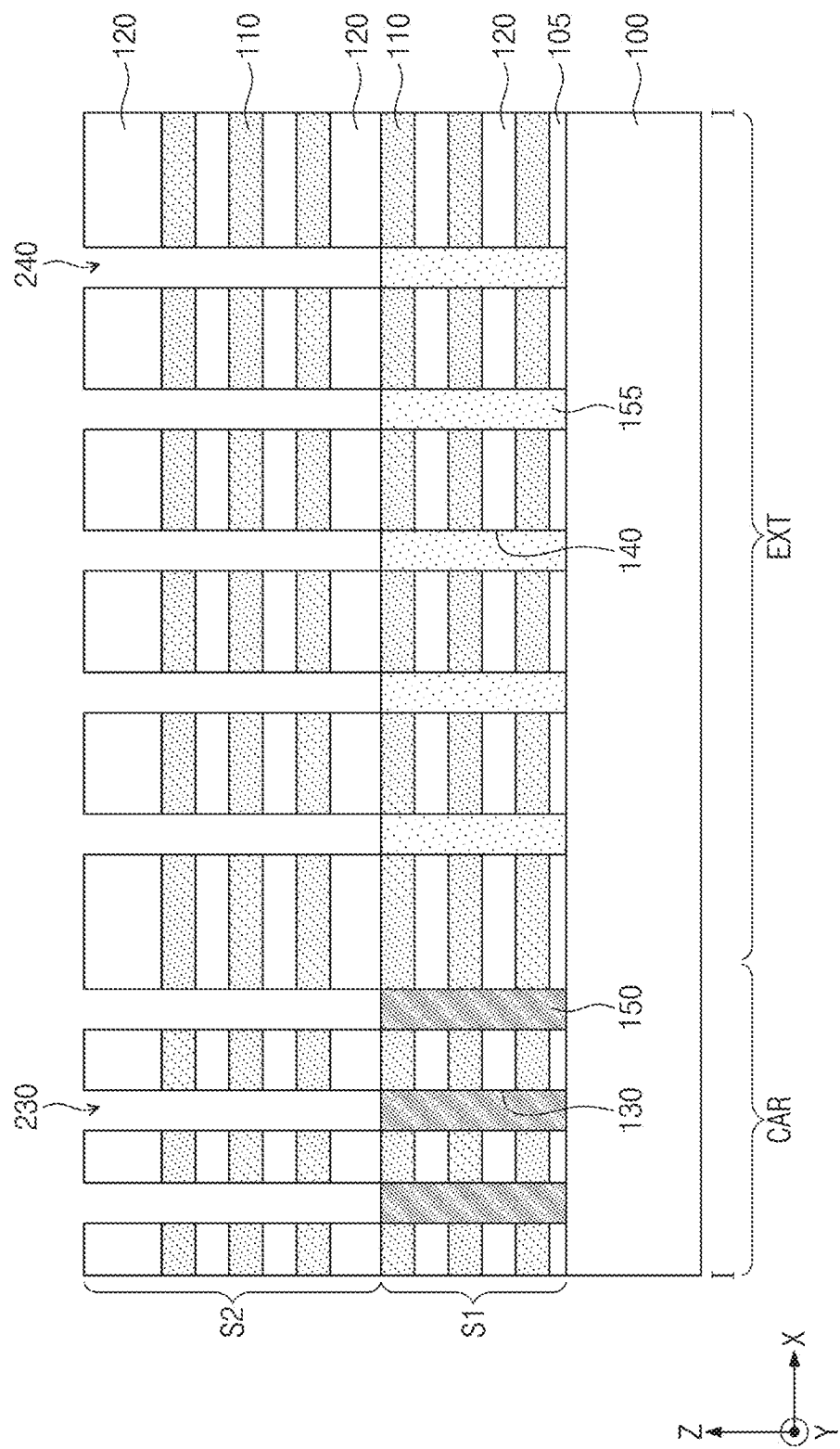
FIGS. 4A to 4F illustrate cross-sectional views taken along the line I-I of FIG. 1B showing a method of fabricating a three-dimensional semiconductor memory device according to some example embodiments of the present inventive concepts.

Referring to FIG. 4A, processes that are identical or similar to those discussed with reference to FIGS. 2A to 2D may be performed to form the first and second stacks S1 and S2 on the semiconductor substrate 100 and to form the second vertical holes 230 and the second dummy vertical holes 240 that are vertically aligned with the first vertical holes 130 and the first dummy vertical holes 140, respectively. The second vertical holes 230 may reveal (e.g., expose) the first sacrificial pillars 150 in the first vertical holes 130, and the second dummy vertical holes 240 may reveal (e.g., expose) the first inactive pillars 155 in the first dummy vertical holes 140.

Figure 4B:
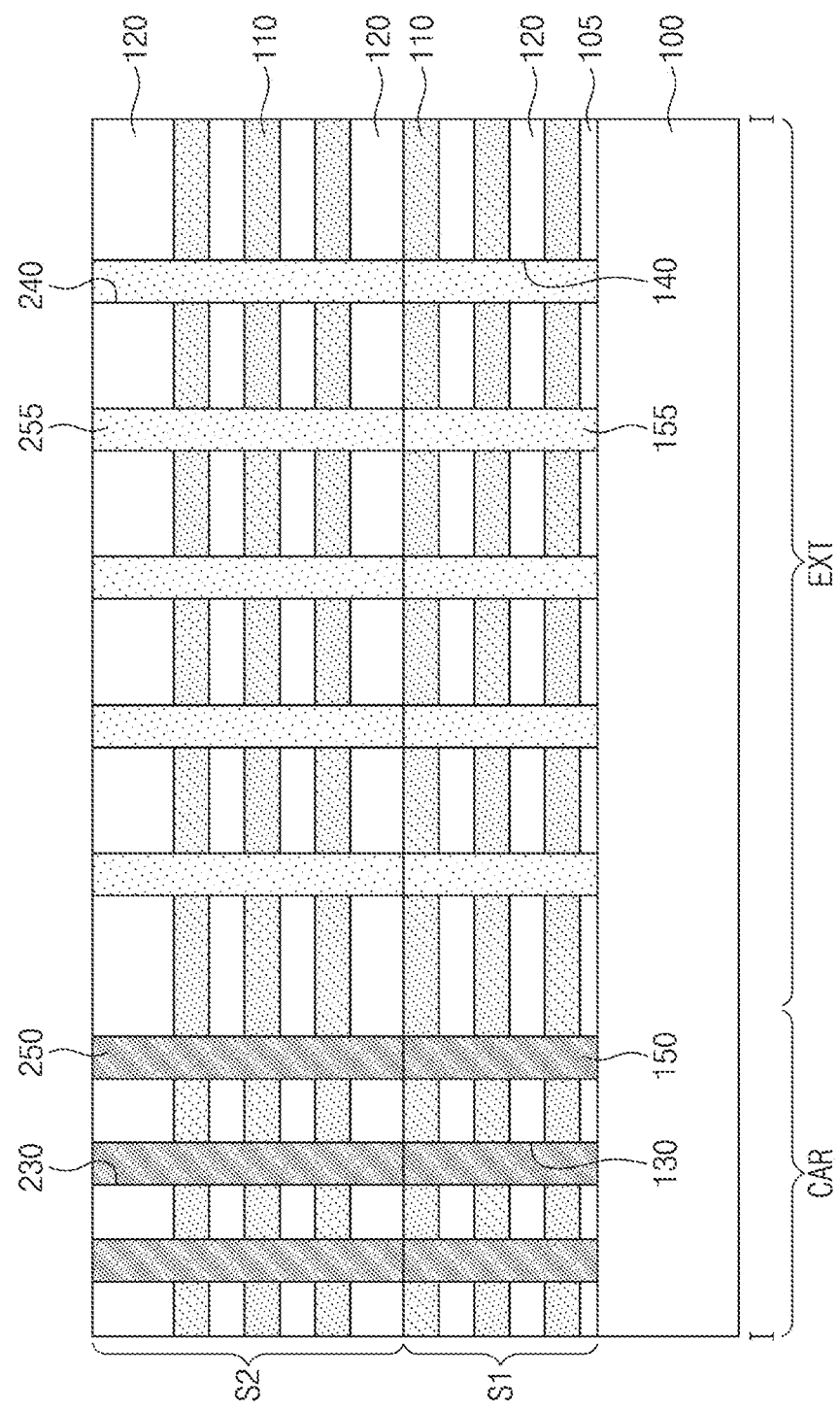

Referring to FIG. 4B, the second sacrificial pillars 250 may be formed in the second vertical holes 230, and the second inactive pillars 255 may be formed in the second dummy vertical holes 240. For example, the second sacrificial pillars 250 may be formed both in the second vertical holes 230 and in the second dummy vertical holes 240, and then a process that is identical or similar to that discussed with reference to FIG. 2C may be performed such that the second inactive pillars 255 may replace the second sacrificial pillars 250 in the second dummy vertical holes 240. Thus, the cell array region CAR may be provided thereon with the first and second sacrificial pillars 150 and 250 that are vertically aligned and in contact with each other, and the extension region EXT may be provided thereon with the first and second inactive pillars 155 and 255 that are vertically aligned and in contact with each other. The first and second sacrificial pillars 150 and 250 may include the same or similar material, for example, polysilicon. The first and second inactive pillars 155 and 255 may include the same or similar material, for example, silicon oxide, silicon nitride, or a combination thereof.

Figure 4C:
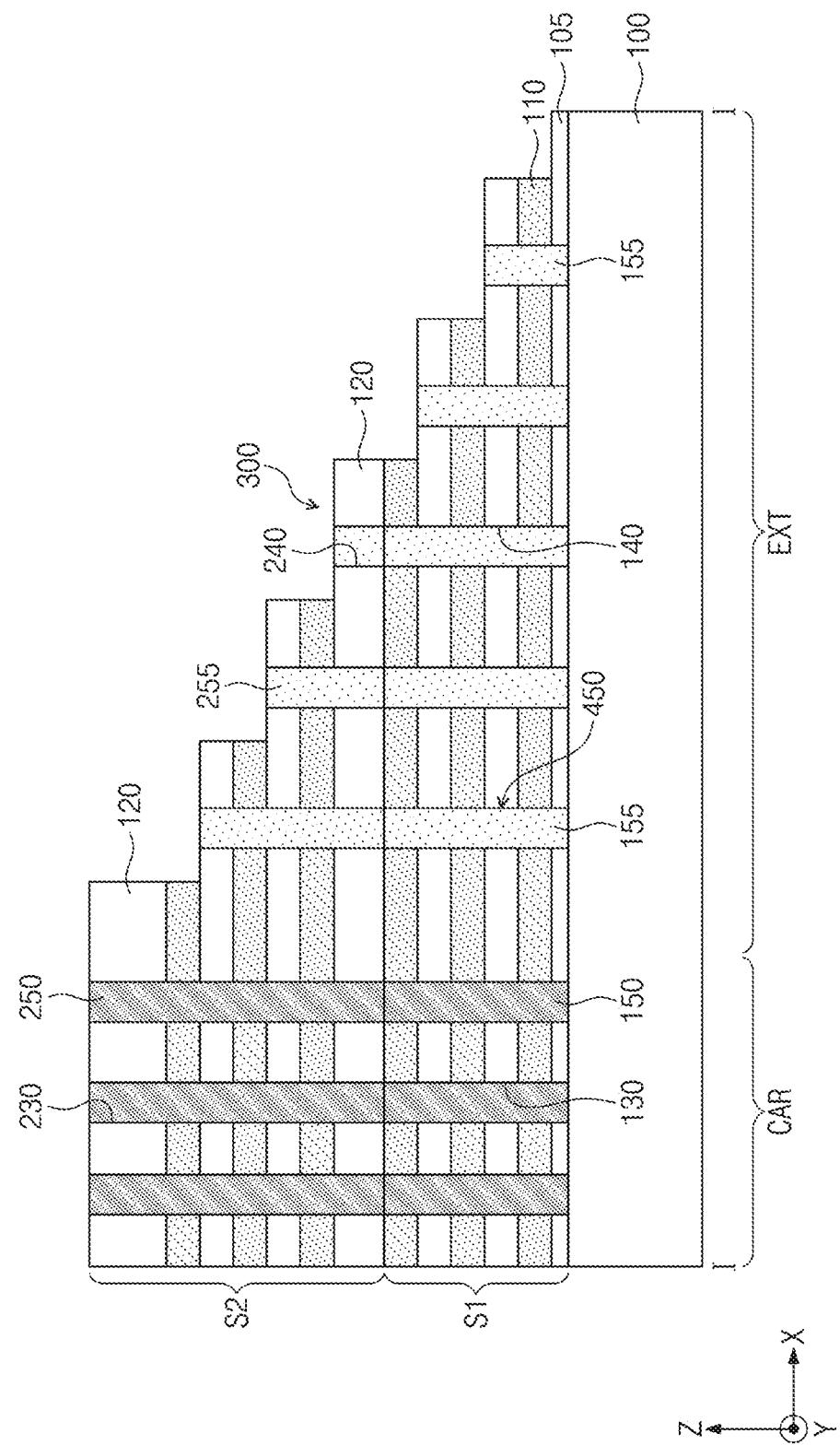

Referring to FIG. 4C, a process that is identical or similar to that discussed with reference to FIG. 2E may be performed. The staircase process may be performed to pattern the first and second stacks S1 and S2 to form the stair-step structure 300 on the semiconductor substrate 100. When the mold dielectric layers 120 and the mold sacrificial layers 110 are etched, the first and second inactive pillars 155 and 255 may be etched at etch rates the same as or similar to those of the mold dielectric layers 120 and the mold sacrificial layers 110. Hence, the stair-step structure 300 may be formed by a single staircase process that patterns both the first and second stacks S1 and S2, and the single staircase process may also form the dummy vertical channels 450 capable of supporting the stair-step structure 300.

At least one of the dummy vertical channels 450 may only include the first inactive pillar 155. For example, the dummy vertical channel 450 farthest away from the cell array region CAR may include only the first inactive pillar 155. At least one of the dummy vertical channels 450 may include a pair of first and second inactive pillars 155 and 255 that are vertically aligned with each other. For example, the dummy vertical channel 450 closest to the cell array region CAR may include the first and second inactive pillars 155 and 255 that are vertically aligned with each other and may have a continuous single body in which the first and second inactive pillars 155 and 255 are in direct contact with each other. The first and second inactive pillars 155 and 255 may have the same dielectric bulk structure.

In some embodiments, a dummy vertical channel 450 that is farthest from the cell array region CAR may include only a single first inactive pillar 155 and may not include a second inactive pillar 255, as illustrated in FIG. 4C. In some embodiments, a dummy vertical channel 450 that is closest to the cell array region CAR may include both a first inactive pillar 155 and a second inactive pillar 255, as illustrated in FIG. 4C, and the second inactive pillar 255 may overlap the first inactive pillar 155 in the third direction Z and may directly contact the first inactive pillar 155, as illustrated in FIG. 4C.

The dummy vertical channels 450 may have different heights from each other. For example, the heights of the dummy vertical channels 450 may decrease (e.g., gradually decrease) along a direction (corresponding to the first direction X of FIG. 1B) from the cell array region CAR toward the extension region EXT. In some embodiments, the dummy vertical channel 450 that is closest to the cell array region CAR may have the largest height, and the dummy vertical channel 450 that is farthest from the cell array region CAR may have the smallest height, as illustrated in FIG. 4C.

Figure 4D:
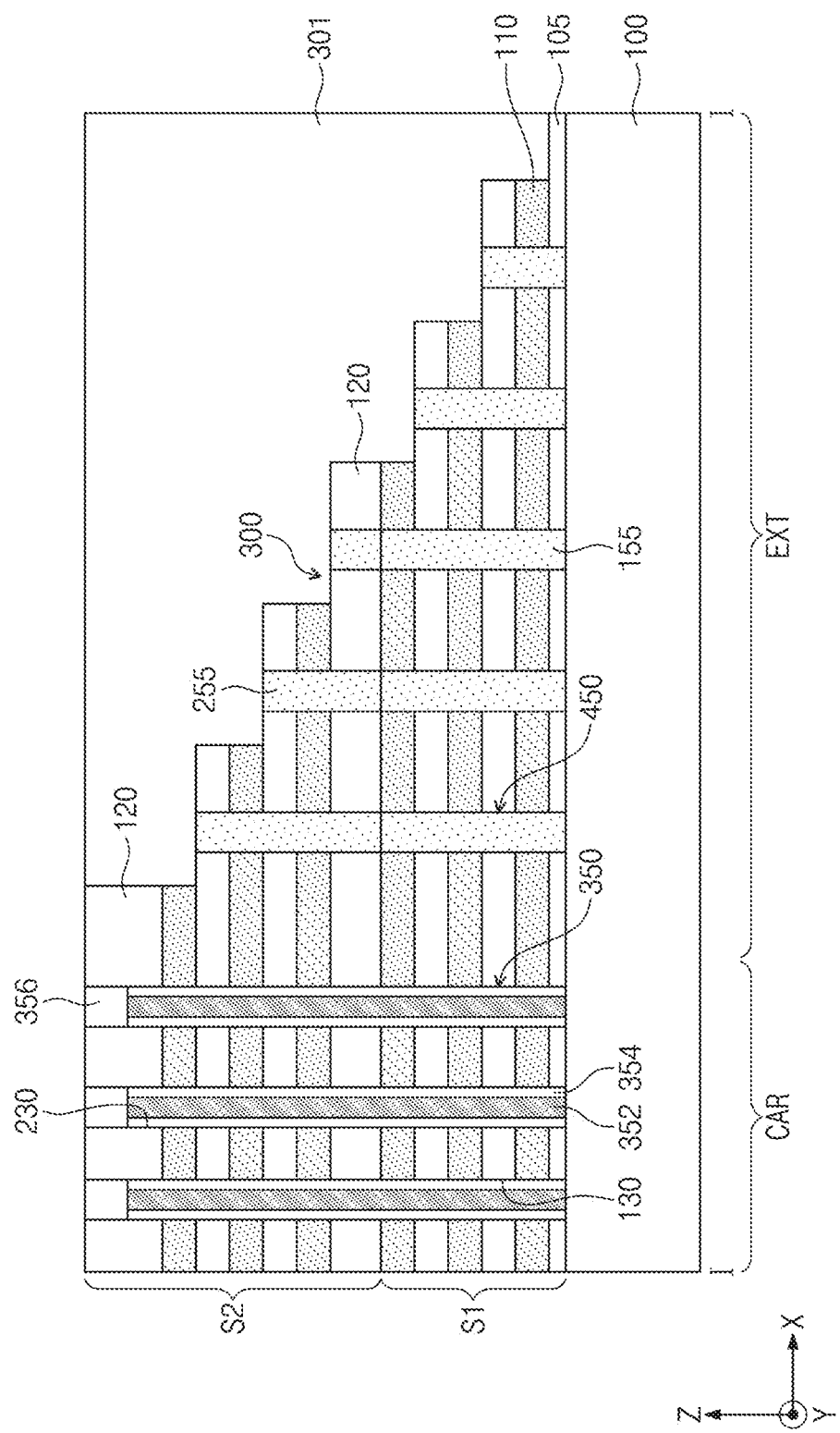

Referring to FIG. 4D, the planarized dielectric layer 301 may be formed to cover the stair-step structure 300 on the semiconductor substrate 100, and a plurality of vertical channels 350 may be formed to penetrate the first and second stacks S1 and S2 and to have electrical connection with the semiconductor substrate 100. For example, an etching process may be performed to selectively remove the first and second sacrificial pillars 150 and 250 from the first and second vertical holes 130 and 230, and then the vertical channels 350 may fill empty first and second vertical holes 130 and 230 from which the first and second sacrificial pillars 150 and 250 are removed.

Figure 4E:
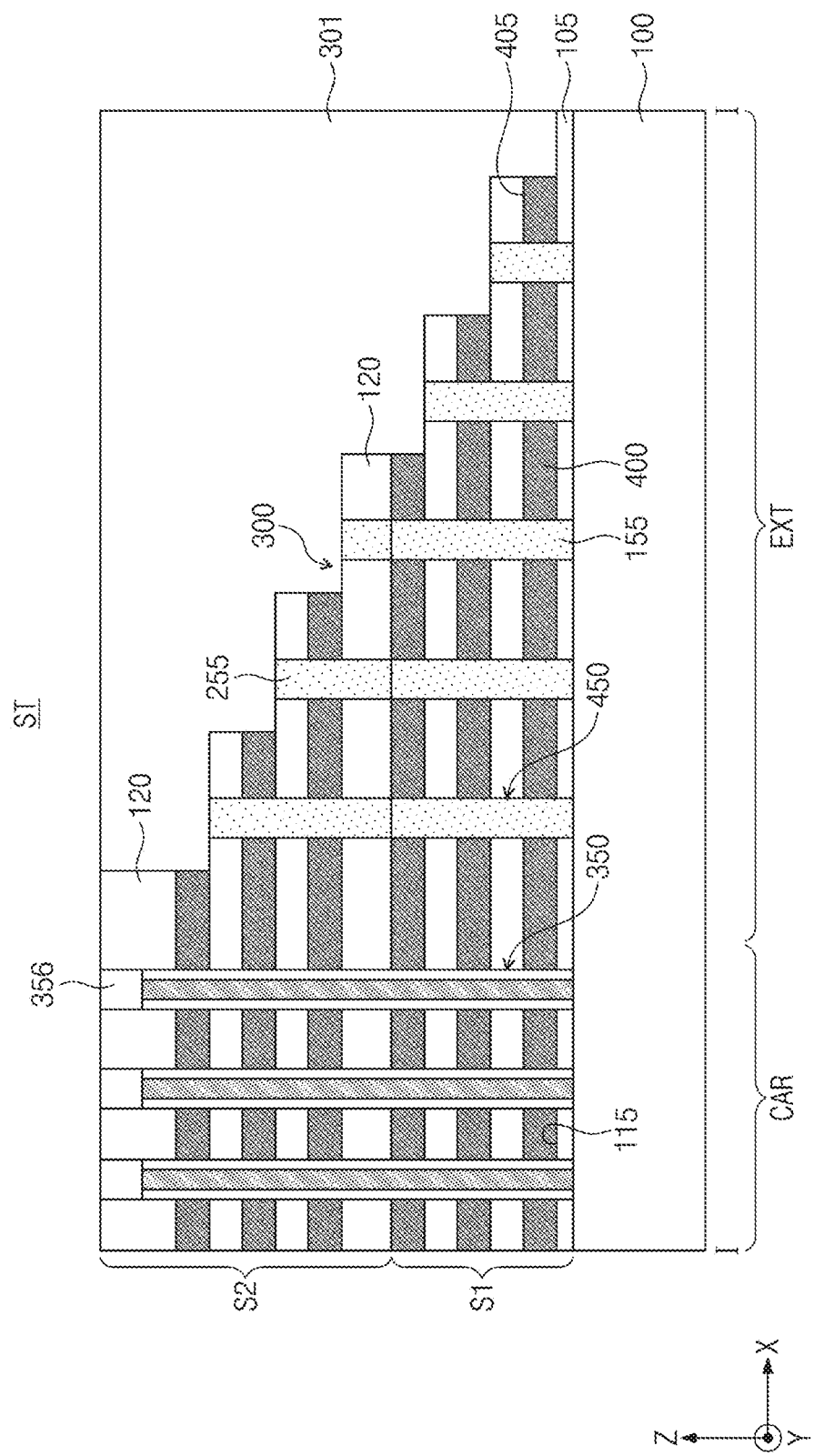

Referring to FIG. 4E, processes that are identical or similar to those discussed with reference to FIGS. 2J and 2K may be performed to selectively remove the mold sacrificial layers 110 to form the spaces 115 and to fill the spaces 115 with a conductive material (e.g., tungsten) to form the electrodes 400. The stack structure ST may then be obtained in which the electrodes 400 are stacked between the mold dielectric layers 120. The dummy vertical channels 450 may not protrude beyond the stair-step structure 300.

Figure 4F:
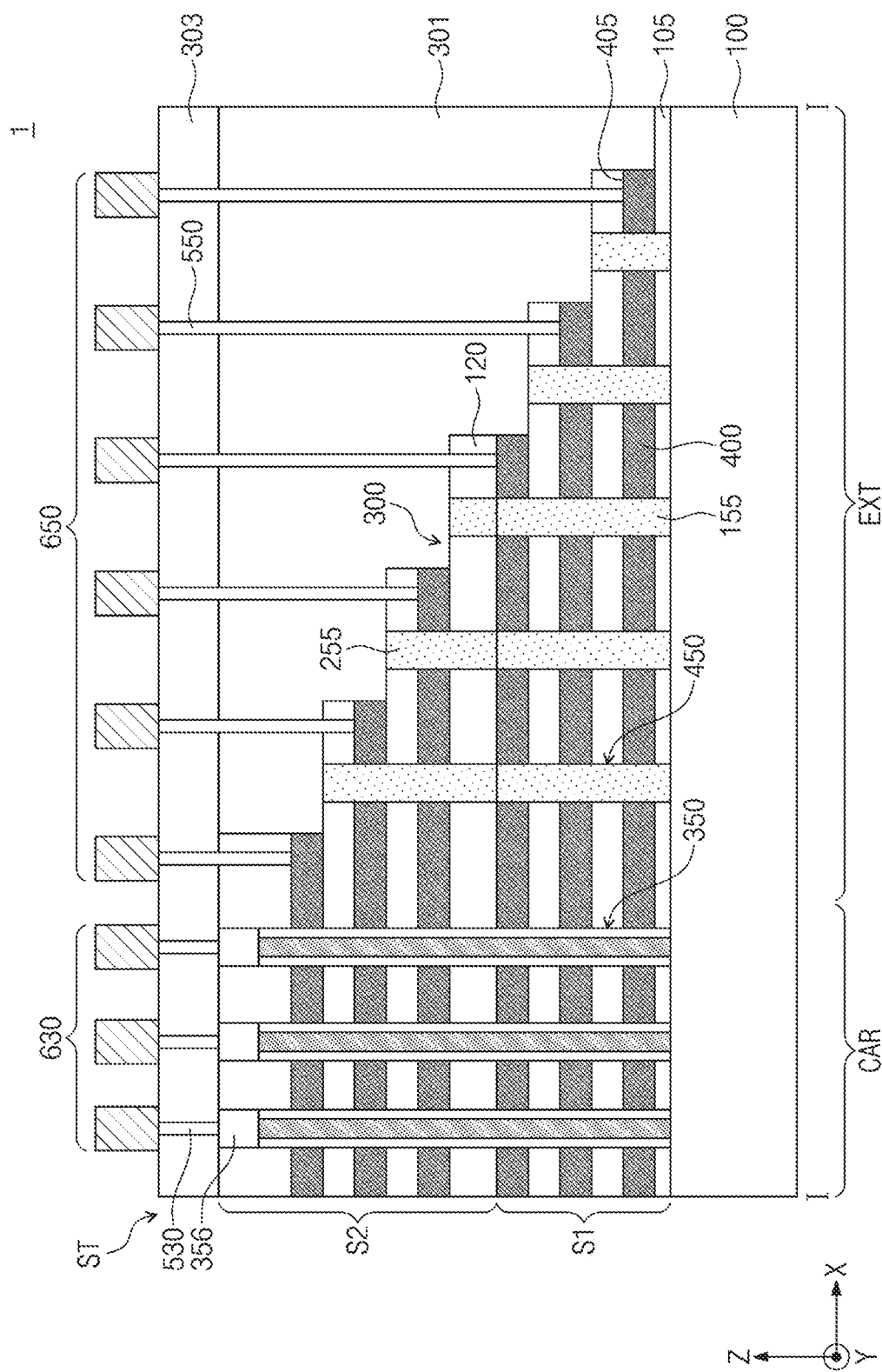

Referring to FIG. 4F, processes that are identical or similar to those discussed with reference to FIG. 2L may be performed to form the interlayer dielectric layer 303 and to form the bit line contacts 530 that penetrate the interlayer dielectric layer 303 and are coupled to (e.g., are electrically connected to) the pads 356 of the vertical channels 350. In addition, the processes may form the metal contacts 550 that penetrate the interlayer dielectric layer 303 and the planarized dielectric layer 301 and are coupled to (e.g., are electrically connected to) the pads 405 of the electrodes 400. On the interlayer dielectric layer 303, the bit lines 630 may be formed to have connection (e.g., electrical connection) with the bit line contacts 530, and the metal lines 650 may be formed to have connection (e.g., electrical connection) with the metal contacts 550.

FIGS. 5A to 5D illustrate cross-sectional views taken along line I-I of FIG. 1B showing a method of fabricating a three-dimensional semiconductor memory device according to some example embodiments of the present inventive concepts.

Figure 5A:
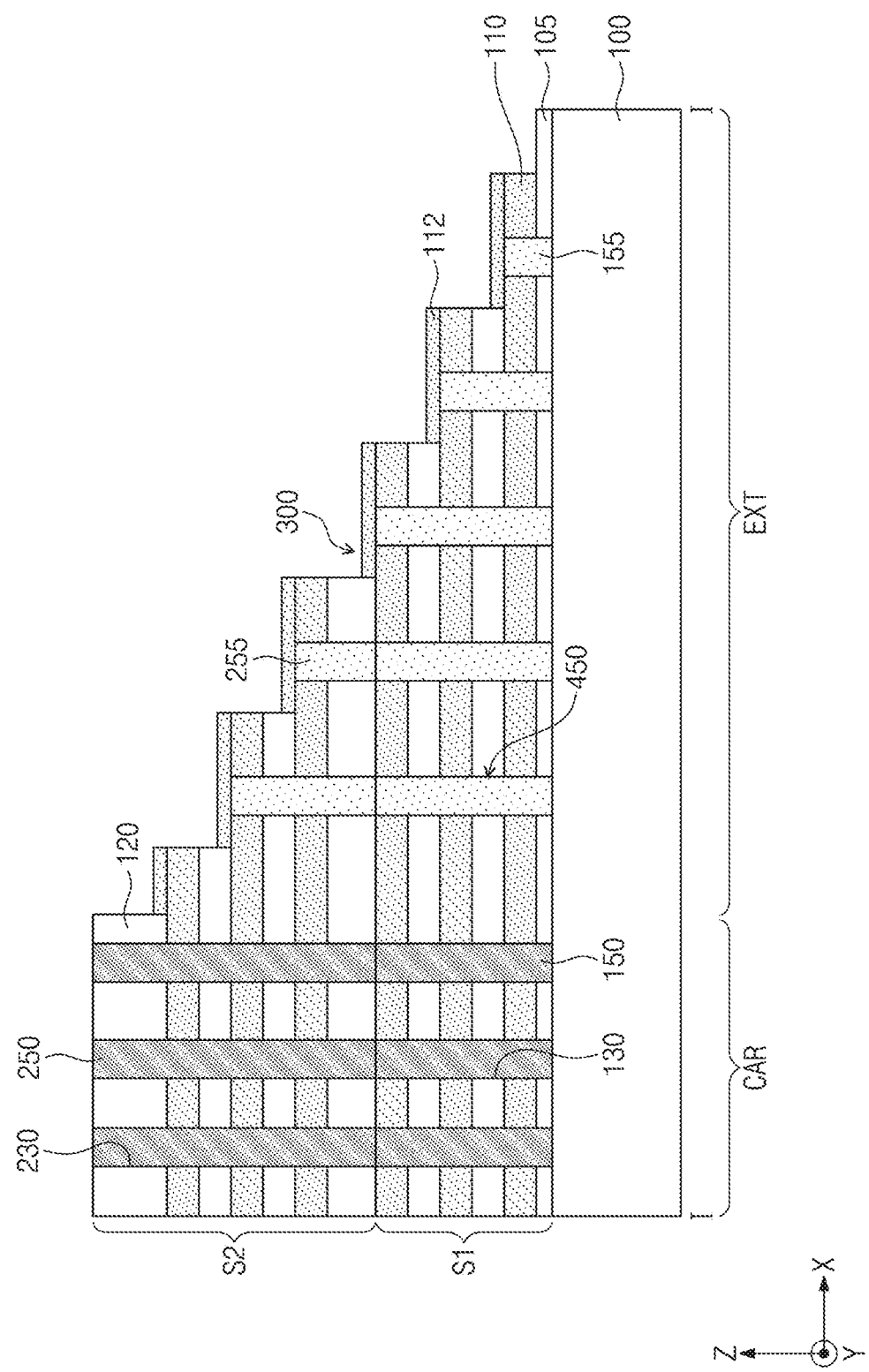
FIGS. 5A to 5D illustrate cross-sectional views taken along the line I-I of FIG. 1B showing a method of fabricating a three-dimensional semiconductor memory device according to some example embodiments of the present inventive concepts.

Referring to FIG. 5A, as discussed with reference to FIGS. 4A to 4C, a single staircase process may be performed to pattern the first stack S1 and the second stack S2. The stair-step structure 300 may then be formed on the extension region EXT, and at the same time, the dummy vertical channels 450 may be formed not to protrude from the stair-step structure 300. In some embodiments, upper portions of the dummy vertical channels 450 may not protrude beyond an upper surface of the stair-step structure 300, as illustrated in FIG. 5A, and therefore the entire dummy vertical channels 450 may be in the stair-step structure 300. The cell array region CAR may be provided thereon with the first and second sacrificial pillars 150 and 250 that are vertically aligned with each other. In some example embodiments, when the stair-step structure 300 is formed, end portions of the mold sacrificial layers 110 may be exposed on the extension region EXT.

After the stair-step structure 300 is formed, the stair-step structure 300 may be provided thereon with the additional mold sacrificial layers 112 including a material the same as or similar to that of the mold sacrificial layers 110. The additional mold sacrificial layers 112 may be formed by a single process (e.g., deposition process) performed on the first and second stacks S1 and S2. The additional mold sacrificial layers 112 may cover the exposed end portions of the mold sacrificial layers 110. The additional mold sacrificial layers 112 may further cover the dummy vertical channels 450.

Figure 5B:
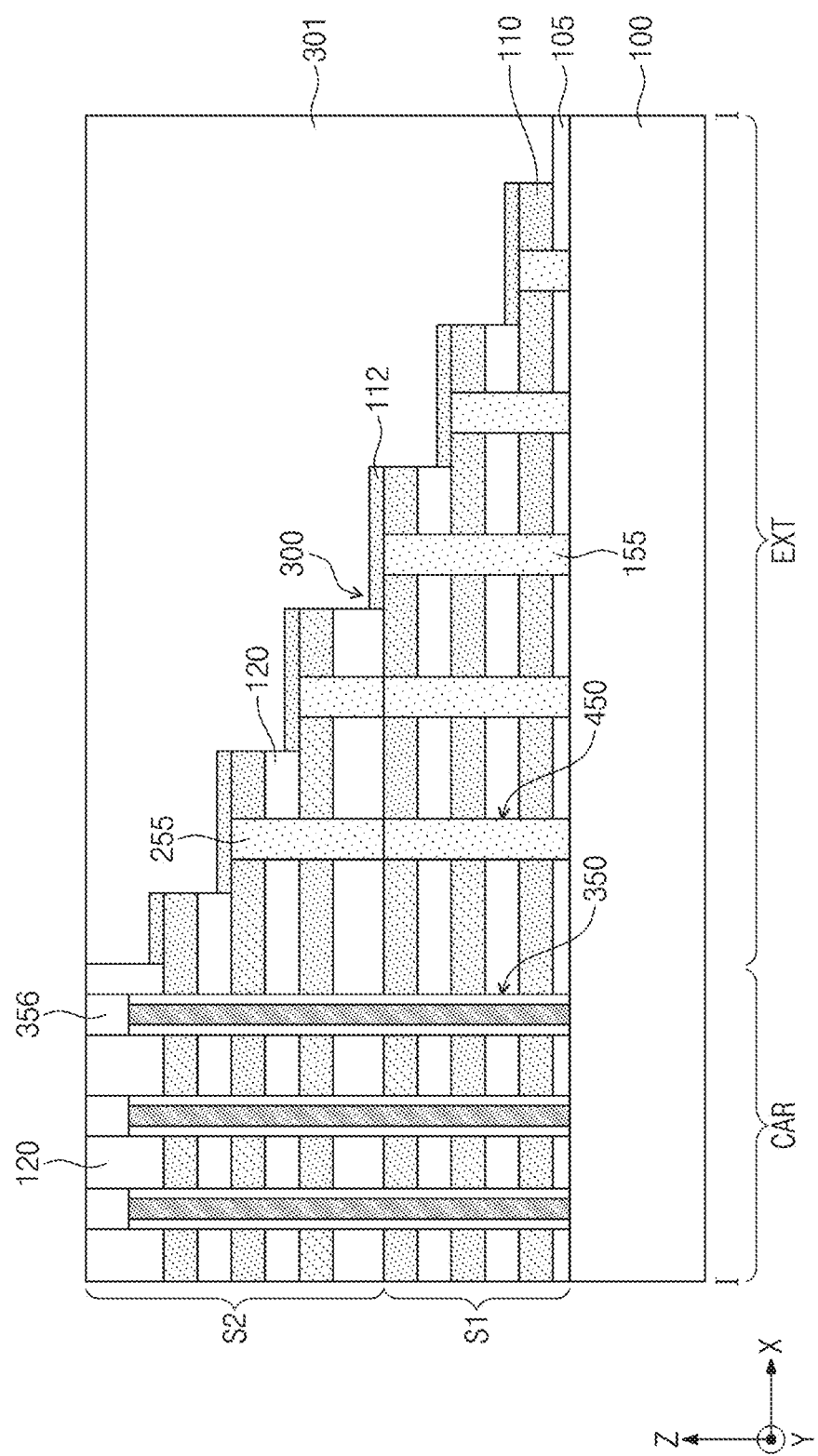

Referring to FIG. 5B, as discussed with reference to FIGS. 4C an 4D, the planarized dielectric layer 301 may be formed to cover the stair-step structure 300, and the vertical channels 350 may be formed on the cell array region CAR. For example, an etching process may be performed to selectively remove the first and second sacrificial pillars 150 and 250 from the first and second vertical holes 130 and 230, and then the vertical channels 350 may fill empty first and second vertical holes 130 and 230 from which the first and second sacrificial pillars 150 and 250 are removed.

Figure 5C:
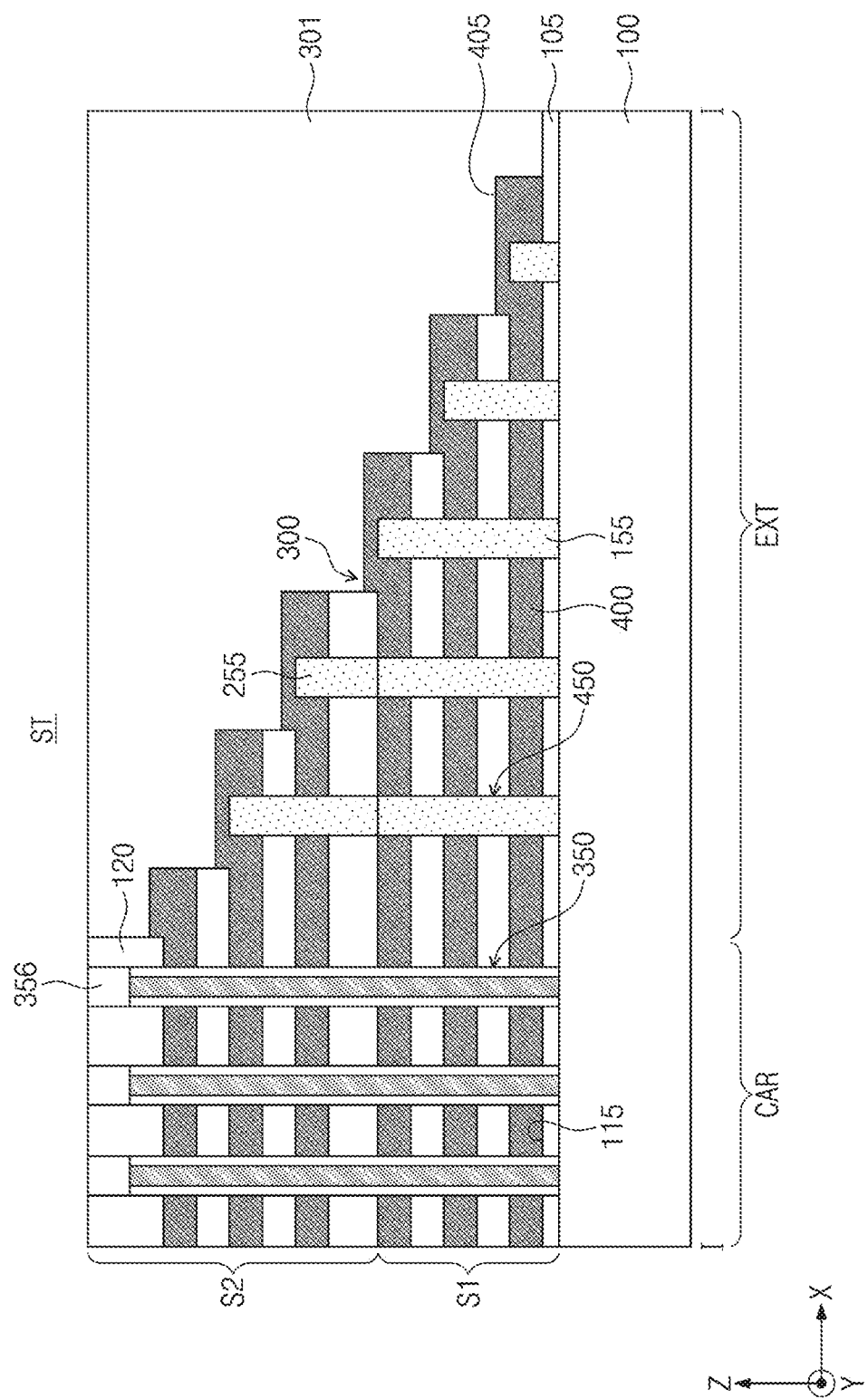

Referring to FIG. 5C, as discussed with reference to FIG. 4E, the mold sacrificial layers 110 may be selectively removed to form the spaces 115. When the spaces 115 are filled with a conductive material (e.g., tungsten) to form the electrodes 400, the stack structure ST may be obtained in which the electrodes 400 are provided between the mold dielectric layers 120. When the mold sacrificial layers 110 are removed, the additional mold sacrificial layers 112 may also be removed to expand end portions of the spaces 115, and thus the pads 405 of the electrodes 400 may have an increased thickness.

Figure 5D:
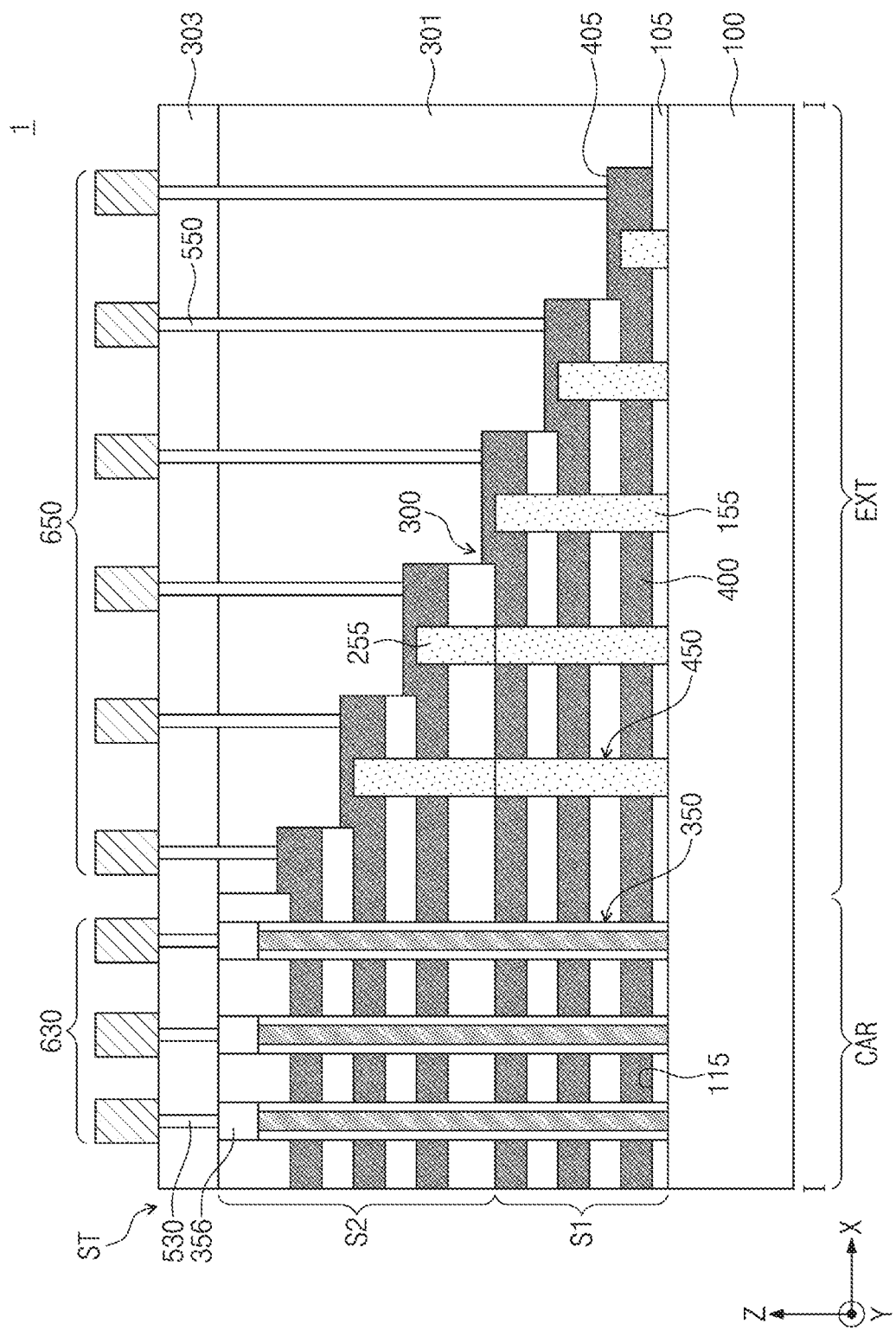

Referring to FIG. 5D, as discussed with reference to FIG. 4F, after the interlayer dielectric layer 303 is formed, the bit line contacts 530 may be formed to penetrate the interlayer dielectric layer 303 and to have connection (e.g., electrical connection) with the pads 356 of the vertical channels 350, and the metal contacts 550 may be formed to penetrate the interlayer dielectric layer 303 and the planarized dielectric layer 301 and to have connection (e.g., electrical connection) with the pads 405 of the electrodes 400. On the interlayer dielectric layer 303, the bit lines 630 may be formed to have connection (e.g., electrical connection) with the bit line contacts 530, and the metal lines 650 may be formed to have connection (e.g., electrical connection) with the metal contacts 550.

According to the present inventive concepts, although the number of stacks formed on a semiconductor substrate is increased, a single staircase process may form a stair-step structure. Because the stair-step structure is formed by a single staircase process, manufacturing costs may be reduced due to process simplification resulting from a decrease in the number of processes.

The advantages compared to the present inventive concepts and the prior art will be apparent through the appended claims and the specification discussed with reference to the accompanying drawings. The present inventive concepts are distinctly claimed and particularly pointed out in the claims. However, the present inventive concepts may best be understood by reference to the specification in conjunction with the accompanying drawings. Like reference numerals refer to like components throughout the specification.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. An integrated circuit device comprising:
   a substrate comprising a cell region and an extension region arranged along a horizontal direction;
   a plurality of conductive layers stacked on the cell region in a vertical direction that is perpendicular to the horizontal direction, wherein the plurality of conductive layers extend onto the extension region and have a stair-step structure on the extension region; and
   a plurality of vertical structures on the substrate, wherein each of the plurality of vertical structures extends in the vertical direction, and the plurality of vertical structures comprise a first vertical structure on the cell region and comprise a second vertical structure and a third vertical structure on the extension region, wherein the first vertical structure extends through the plurality of conductive layers and comprises a first channel layer, wherein the second vertical structure is in the stair-step structure of the plurality of conductive layers and comprises an upper portion comprising a second channel layer and a lower portion comprising a first insulating layer, and the lower portion of the second vertical structure is between the substrate and the upper portion of the second vertical structure, wherein the third vertical structure comprises a second insulating layer and is spaced apart from the first insulating layer of the lower portion of the second vertical structure in the horizontal direction, wherein the second channel layer is spaced apart from the substrate in the vertical direction, wherein the second channel layer of the upper portion of the second vertical structure directly contacts the first insulating layer of the lower portion of the second vertical structure, and wherein a vertical length of the second insulating layer of the third vertical structure is different from a vertical length of the first insulating layer of the lower portion of the second vertical structure.

2. The integrated circuit device of claim 1,
wherein the lower portion of the second vertical structure has a unitary structure comprising the first insulating layer.

3. The integrated circuit device of claim 1,
wherein the second insulating layer of the third vertical structure is free of the first and second channel layers.

4. The integrated circuit device of claim 1, wherein the plurality of vertical structures further comprises a fourth vertical structure on the extension region,
wherein the fourth vertical structure overlaps the second insulating layer of the third vertical structure and is spaced apart from the second insulating layer of the third vertical structure in the vertical direction.

5. The integrated circuit device of claim 4, wherein the first channel layer of the first vertical structure, the second channel layer of the second vertical structure, and the fourth vertical structure are sequentially arranged along the horizontal direction, and
wherein a lowermost end of the second channel layer of the second vertical structure is at a first level, and an uppermost end of the second insulating layer of the third vertical structure is at a second level that is lower than the first level.

6. The integrated circuit device of claim 4, wherein the fourth vertical structure comprises a third channel layer, and
wherein the third channel layer is spaced apart from the stair-step structure of the plurality of conductive layers in the vertical direction.

7. The integrated circuit device of claim 4,
wherein the fourth vertical structure comprises a third channel layer that is spaced apart from the substrate in the vertical direction, and
wherein a lowermost end of the second channel layer of the second vertical structure is at a first level, and a lowermost end of the third channel layer of the fourth vertical structure is at a second level that is lower than the first level.

8. An integrated circuit device comprising:
a substrate comprising a first region and a second region arranged along a horizontal direction;
a stack structure on the substrate, wherein the stack structure comprises a plurality of conductive layers stacked on the first region of the substrate in a vertical direction that is perpendicular to the horizontal direction, and wherein the plurality of conductive layers extend onto the second region of the substrate and have a stair-step structure on the second region of the substrate;
a plurality of vertical structures on the substrate, wherein each the plurality of vertical structures extends in the vertical direction; and
a dielectric layer on the stair-step structure of the plurality of conductive layers,
wherein the plurality of vertical structures comprise:
a first vertical structure that is on the first region of the substrate and extends through the plurality of conductive layers;
a second vertical structure that is on the second region of the substrate and extends through the dielectric layer and the stair-step structure of the plurality of conductive layers; and
a third vertical structure that is on the second region of the substrate and extends through the stair-step structure of the plurality of conductive layers,
wherein the dielectric layer covers at least portion of a top surface of the third vertical structure.

9. The integrated circuit device of claim 8, wherein the first vertical structure comprises a first channel layer that directly contacts the substrate, and
wherein the second vertical structure comprises a second channel layer that is spaced apart from the substrate in the vertical direction.

10. The integrated circuit device of claim 9, wherein an uppermost end of the first channel layer and an uppermost end of the second channel layer are at an equal level.

11. The integrated circuit device of claim 8, wherein the plurality of vertical structures further comprises a fourth vertical structure extending through the dielectric layer and overlapping the third vertical structure,
wherein the first vertical structure, the second vertical structure, and the fourth vertical structure are sequentially arranged along the horizontal direction, and
wherein the fourth vertical structure is spaced apart from the third vertical structure.

12. An integrated circuit device comprising:
a substrate comprising a cell region and an extension region arranged along a horizontal direction;
a stack structure on the substrate, wherein the stack structure comprises a plurality of conductive layers stacked on the cell region in a vertical direction that is perpendicular to the horizontal direction, and wherein the plurality of conductive layers extend onto the extension region and have a stair-step structure on the extension region; and
a plurality of vertical structures on the substrate, wherein the plurality of vertical structures comprise:
a first vertical structure extending through the plurality of conductive layers on the cell region;
a second vertical structure extending through the stair-step structure of the plurality of conductive layers, wherein the second vertical structure comprises a lower portion and an upper portion sequentially stacked on the substrate, and wherein the lower portion of the second vertical structure comprises a first insulating layer; and
a third vertical structure that extends through the stair-step structure of the plurality of conductive layers and comprises a second insulating layer, wherein each of the first and second insulating layers comprises a lower surface directly contacting the substrate and an upper surface opposite the lower surface, and the upper surface of the second insulating layer is closer to the substrate than the upper surface of the first insulating layer.

13. The integrated circuit device of claim 12, wherein the first vertical structure comprises a first channel layer, and
wherein the upper portion of the second vertical structure comprises a second channel layer that is spaced apart from the substrate.

14. The integrated circuit device of claim 13, wherein the lower portion of the second vertical structure has a unitary structure comprising the first insulating layer.

15. The integrated circuit device of claim 12, wherein the first vertical structure comprises a first channel layer, and a lowermost end of the first channel layer is at a first level, and
wherein the second vertical structure comprises a second channel layer and a lowermost end of the second channel layer is at a second level that is higher than the first level.

16. The integrated circuit device of claim 15, wherein an uppermost end of the first channel layer and an uppermost end of the second channel layer are at an equal level.

17. The integrated circuit device of claim 12, wherein a lowermost end of the upper portion of the second vertical structure has a first width in the horizontal direction, an uppermost end of the lower portion of the second vertical structure has a second width in the horizontal direction, and the second width is greater than the first width.

18. The integrated circuit device of claim 12, wherein the first vertical structure, the second vertical structure, and the third vertical structure are sequentially arranged along the horizontal direction.

19. The integrated circuit device of claim 3, wherein the second channel layer of the upper portion of the second vertical structure comprises a lower surface facing the substrate, and an entirety of the lower surface of the second channel layer directly contacts the first insulating layer of the lower portion of the second vertical structure.

20. The integrated circuit device of claim 11, wherein the fourth vertical structure comprises a lower surface facing the substrate, and the lower surface of the fourth vertical structure directly contacts the dielectric layer.

* * * * *